(12) United States Patent
Takita

(10) Patent No.: US 8,771,907 B2
(45) Date of Patent: *Jul. 8, 2014

(54) POSITIVE PHOTOSENSITIVE RESIN COMPOSITION AND METHOD OF FORMING CURED FILM FROM THE SAME

(75) Inventor: Satoshi Takita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/891,558

(22) Filed: Sep. 27, 2010
(Under 37 CFR 1.47)

(65) Prior Publication Data

US 2011/0177302 A1 Jul. 21, 2011

Related U.S. Application Data

(63) Continuation of application No. PCT/JP2009/056555, filed on Mar. 30, 2009.

(30) Foreign Application Priority Data

Mar. 28, 2008 (JP) ................................ 2008-088537
Mar. 28, 2008 (JP) ................................ 2008-088540

(51) Int. Cl.
G03F 7/039 (2006.01)
G03F 7/085 (2006.01)
G03F 7/20 (2006.01)
G03F 7/40 (2006.01)

(52) U.S. Cl.
USPC .......... 430/18; 430/326; 430/280.1; 430/394; 430/330

(58) Field of Classification Search
None
See application file for complete search history.

(56) References Cited

U.S. PATENT DOCUMENTS

| 5,055,374 | A | 10/1991 | Seio et al. |
| 5,120,633 | A | 6/1992 | Bauer et al. |
| 5,362,597 | A | 11/1994 | Sano et al. |
| 2004/0235992 | A1 | 11/2004 | Okada et al. |
| 2005/0202261 | A1 | 9/2005 | Takai et al. |
| 2007/0292768 | A1 | 12/2007 | Ohsawa et al. |
| 2010/0173246 | A1 | 7/2010 | Takita |

FOREIGN PATENT DOCUMENTS

| EP | 1 422 564 A1 | 5/2004 |
| EP | 2154571 A1 * | 2/2010 |
| EP | 2 196 852 A1 | 6/2010 |
| GB | 1 512 814 A | 5/2004 |
| JP | 02-042446 A | 2/1990 |
| JP | 05-165214 A | 7/1993 |
| JP | 05-506731 A | 9/1993 |
| JP | 06-059444 A | 3/1994 |
| JP | 10-153854 A | 6/1998 |
| JP | 2004-004669 A | 1/2004 |
| JP | 2004-264623 A | 9/2004 |
| JP | 2005-017321 A | 1/2005 |
| JP | 2006-251296 A | 9/2006 |
| JP | 2007-108761 A | 4/2007 |
| JP | 2007-128062 A | 5/2007 |
| JP | 2007-333933 A | 12/2007 |
| TW | 2004-28021 A | 12/2004 |
| WO | 2005/052688 A2 | 6/2005 |
| WO | 2007/047384 A1 | 4/2007 |
| WO | 2008/149947 A1 | 12/2008 |
| WO | 2009/041619 A1 | 4/2009 |

OTHER PUBLICATIONS

English translation of JP, 2006-251296, A (2006) from machine translation from AIPN Japan Patent Office National Center for Industrial Property Information and Training, generated Nov. 27, 2011, 27 pages.*
DERWENT-ACC-NO: 2004-693575, English abstract of JP 2004264623 A, Nishikawa et al, Derwent Information LTD, from Derwent Week—201057, 4 pages printed Apr. 14, 2014 from DERWENT file of East database Showing equivalency with TW 200428021 A.*
Ciba IRAGACURE PAG103, Switzerland, Ciba Specialty Chemicals, Nov. 16, 2005, [Search on Jun. 21, 2010] URL, http://www.ciba.com/de/ind-em-irgacure_pag103.pdf#search='ciba%20irgacure%20103'.
English Translation of International Preliminary Report of Patentability, PCT/JP2009/056555, 2009.
Chinese Office Action issued in corresponding application No. 098110034 dated Dec. 17, 2013.

* cited by examiner

Primary Examiner — Cynthia Hamilton
(74) Attorney, Agent, or Firm — Sughrue Mion, PLLC

(57) ABSTRACT

According to one embodiment, a positive photosensitive resin composition includes a resin containing a specified acrylic acid besed-structural unit which generates a carboxyl group when its dissociative group is dissociated, which resin is insoluble in alkali or sparingly soluble in alkali but when its acid-dissociative group is dissociated, becomes soluble in alkali, a resin containing a structural unit derived from a radical-polymerizable monomer containing an epoxy group, a compound containing two or more epoxy groups in its molecule, provided that the resin containing the structural unit derived from a radical-polymerizable monomer containing an epoxy group is not included in this compound, and a compound that when exposed to actinic rays of 300 nm or longer wavelength, generates an acid.

22 Claims, No Drawings

POSITIVE PHOTOSENSITIVE RESIN COMPOSITION AND METHOD OF FORMING CURED FILM FROM THE SAME

CROSS-REFERENCE TO RELATED APPLICATIONS

This is a Continuation Application of PCT Application No. PCT/JP2009/056555, filed Mar. 30, 2009, which was published under PCT Article 21(2) in Japanese.

This application is based upon and claims the benefit of priority from prior Japanese Patent Applications No. 2008-088537, filed Mar. 28, 2008; and No. 2008-088540, filed Mar. 28, 2008, the entire contents of both of which are incorporated herein by reference.

BACKGROUND OF THE INVENTION

1. Field of the Invention

The present invention relates to a positive photosensitive resin composition and a method of forming a cured film from the same. More particularly, the present invention relates to a positive photosensitive resin composition that can be appropriately used in the formation of a planarizing film, protective film or interlayer insulating film for electronic components, such as a liquid crystal display device, an integrated circuit device, a solid-state image sensor and an organic EL, and relates to a method of forming a cured film from the same.

2. Description of the Related Art

In the field of electronic components, such as a liquid crystal display device, an integrated circuit device, a solid-state image sensor and an organic EL, it is of conventional general practice to use a photosensitive resin composition in the formation of a planarizing film for planarizing the surface of electronic components, a protective film for preventing the deterioration and damaging of electronic components or an interlayer insulating film for maintaining the insulation of electronic components. For example, a TFT liquid crystal display device is manufactured in the following manner. First, a polarizing sheet is disposed on a glass substrate, and a transparent conductive circuit layer of ITO or the like and a thin-film transistor (TFT) are formed thereon. Further, the thus obtained laminate is coated with an interlayer insulating film, thereby obtaining a back plate. Separately, a polarizing sheet is disposed on a glass substrate, and according to necessity patterns of black matrix layer and color filter layer are formed thereon. Further, a transparent conductive circuit layer and an interlayer insulating film are sequentially provided thereon, thereby obtaining a top plate. The back plate and the top plate are arranged opposite to each other with a spacer therebetween, and a liquid crystal is sealed in the interspace of the plates, thereby obtaining a TFT liquid crystal display device. In this process, a photosensitive resin composition is used in the formation of the interlayer insulating films. It is required for such a photosensitive resin composition to excel in the sensitivity, film retention ratio, heat resistance, adherence and transparency. Further, it is required for the photosensitive resin composition to excel in the aging stability during storage.

With respect to such a photosensitive resin composition, for example, patent reference 1 proposes a photosensitive resin composition which comprises (A) a resin soluble in alkali aqueous solutions that is a polymer of (a) an unsaturated carboxylic acid or unsaturated carboxylic anhydride, (b) a radical-polymerizable compound containing an epoxy group and (c) another radical-polymerizable compound and (B) a radiation-sensitive acid generating compound. Patent reference 2 proposes a photosensitive resin composition which comprises an alkali-soluble acrylic polymer binder, a compound containing a quinone diazide group, a crosslinking agent and a photoacid generator. However, both of these photosensitive resin compositions are not satisfactory in the sensitivity, film retention ratio in unexposed areas, resolution and aging stability, so that they have been unsatisfactory from the viewpoint of manufacturing a liquid crystal display device of high quality. Moreover, patent reference 3 proposes a positive chemically amplifiable resist composition comprising a crosslinking agent, an acid generator and a resin that is itself insoluble or sparingly soluble in an alkali aqueous solution but has a protective group cleavable by the action of an acid and that once the protective group is cleaved, becomes soluble in an alkali aqueous solution. However, this resist composition is not satisfactory in the adherence and transmission, so that it has been unsatisfactory from the viewpoint of manufacturing a liquid crystal display device of high quality. Patent reference 4 proposes a radiation-sensitive resin composition comprising a resin of acetal structure and/or ketal structure containing an epoxy group and an acid generator. However, the composition has poor sensitivity, rendering the composition unsatisfactory.

[Patent reference 1] Jpn. Pat. Appln. KOKAI Publication No. (hereinafter referred to as JP-A-) H5-165214,
[Patent reference 2] JP-A-H10-153854,
[Patent reference 3] JP-A-2004-4669, and
[Patent reference 4] JP-A-2004-264623.

BRIEF SUMMARY OF THE INVENTION

It is a task of the present invention to provide a positive photosensitive resin composition excelling in the sensitivity, film retention ratio and storage stability and provide a method of forming a cured film from the composition. It is a particular task of the present invention to provide a positive photosensitive resin composition from which a cured film excelling in the heat resistance, adherence, transmission, etc. can be obtained by curing thereof and provide a method of forming a cured film from the composition.

The inventor has conducted extensive and intensive studies with the intent to solve the above problem, and has arrived at the present invention.

The present invention in its one aspect is as follows.

(1) A positive photosensitive resin composition comprising (A1) a resin containing any of structural units of general formula (1) below, which resin is insoluble in alkali or sparingly soluble in alkali but when its acid-dissociative group is dissociated, becomes soluble in alkali; (A2) a polymer or copolymer containing a structural unit derived from a radical-polymerizable monomer containing an epoxy group; (B) a compound containing two or more epoxy groups in its molecule, provided that the polymer or copolymer (A2) is not included in this compound; and (C) a compound that when exposed to actinic rays of 300 nm or longer wavelength, generates an acid,

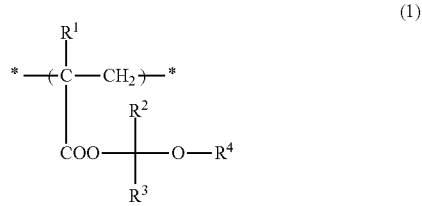

(1)

in which

R¹ represents a hydrogen atom, a methyl group, a halogen atom or a cyano group, each of R² and R³ independently represents a hydrogen atom, or a linear or branched alkyl group, provided that R² and R³ are not simultaneously hydrogen atoms, and R⁴ represents an optionally substituted linear, branched or cyclic alkyl or aralkyl group, provided that R² and R⁴ may be linked to each other to thereby form a cyclic ether.

(2) The positive photosensitive resin composition according to item (1), wherein the component (A2) contains the structural unit derived from a radical-polymerizable monomer containing an epoxy group and any of structural units of general formula (1).

(3) The positive photosensitive resin composition according to item (1), wherein the radical-polymerizable monomer containing an epoxy group, contained in the component (A2) contains an alicyclic structure having an epoxy group.

(4) The positive photosensitive resin composition according to item (3), wherein the radical-polymerizable monomer containing an epoxy group is 3,4-epoxycyclohexylmethyl acrylate or 3,4-epoxycyclohexylmethyl methacrylate.

(5) A positive photosensitive resin composition comprising (A') a resin containing not only any of structural units of general formula (1) below but also a structural unit containing a functional group capable of reacting with a carboxyl group to thereby form a covalent bond, which resin is insoluble in alkali or sparingly soluble in alkali but when its acid-dissociative group is dissociated, becomes soluble in alkali; (B) a compound containing two or more epoxy groups in its molecule, provided that the resin (A') is not included in this compound; and (C) a compound that when exposed to actinic rays of 300 nm or longer wavelength, generates an acid,

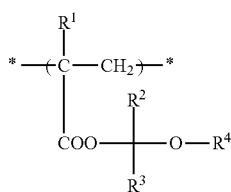

(1)

in which

R¹ represents a hydrogen atom, a methyl group, a halogen atom or a cyano group, each of R² and R³ independently represents a hydrogen atom, or a linear or branched alkyl group, provided that R² and R³ are not simultaneously hydrogen atoms, and R⁴ represents an optionally substituted linear, branched or cyclic alkyl or aralkyl group, provided that R² and R⁴ may be linked to each other to thereby form a cyclic ether.

(6) The positive photosensitive resin composition according to item (5), wherein the functional group capable of reacting with a carboxyl group to thereby form a covalent bond, contained in the component (A') is an epoxy group.

(7) The positive photosensitive resin composition according to item (6), wherein the structural unit containing an epoxy group contains an alicyclic structure having an epoxy group.

(8) The positive photosensitive resin composition according to item (7), wherein the structural unit containing an alicyclic structure having an epoxy group is the structural unit derived from 3,4-epoxycyclohexylmethyl acrylate or 3,4-epoxycyclohexylmethyl methacrylate.

(9) The positive photosensitive resin composition according to item (5), wherein the functional group capable of reacting with a carboxyl group to thereby form a covalent bond, contained in the component (A') is an oxetane group.

(10) The positive photosensitive resin composition according to any of items (1) to (9), wherein the component (C) contains a compound containing any of oxime sulfonate groups of general formula (2) below,

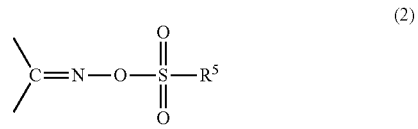

(2)

in which

R⁵ represents an optionally substituted linear, branched or cyclic alkyl group or an optionally substituted aryl group.

(11) The positive photosensitive resin composition according to any of items (1) to (9), wherein the component (C) contains any of compounds of general formula (3) below,

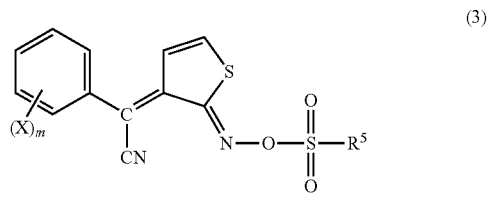

(3)

in which

R⁵ represents an optionally substituted linear, branched or cyclic alkyl group or an optionally substituted aryl group, X represents an alkyl group, an alkoxy group or a halogen atom, and m is an integer of 0 to 3, provided that when m is 2 or 3, a plurality of X's may be identical to or different from each other.

(12) The positive photosensitive resin composition according to any of items (1) to (11), further comprising an adhesion aid (D).

(13) A method of forming a cured film, comprising the steps of applying the positive photosensitive resin composition according to any of items (1) to (12) to a substrate and drying the applied composition to thereby form a film; exposing the film through a mask to actinic rays of 300 nm or longer wavelength; developing the exposed film with an alkali developer to thereby form a pattern; and baking the formed pattern.

(14) The method of forming a cured film according to item (13), further comprising exposing the pattern on its entire surface after the development with an alkali developer to thereby form a pattern but before the baking of the formed pattern.

(15) A cured film obtained by the method of item (13) or (14).

Further, preferred embodiments of the present invention will be mentioned below.

(16) The positive photosensitive resin composition according to any of items (1) to (4) and (10) to (12) above, wherein the component (B) is contained in an amount of 1 to 50 parts by mass per 100 parts by mass of the total amount of components (A1) and (A2).

(17) The positive photosensitive resin composition according to any of items (1) to (4), (10) to (12) and (16) above, wherein the component (C) is contained in an amount of 0.1 to 10 parts by mass per 100 parts by mass of the total amount of components (A1) and (A2).

(18) The positive photosensitive resin composition according to any of items (12), (16) and (17) above, wherein the component (D) is contained in an amount of 0.1 to 20 parts by mass per 100 parts by mass of the total amount of components (A1) and (A2).

(19) The positive photosensitive resin composition according to any of items (5) to (12) above, wherein the component (B) is contained in an amount of 1 to 50 parts by mass per 100 parts by mass of the total amount of component (A').

(20) The positive photosensitive resin composition according to any of items (5) to (12) and (19) above, wherein the component (C) is contained in an amount of 0.1 to 10 parts by mass per 100 parts by mass of the total amount of component (A').

(21) The positive photosensitive resin composition according to any of items (12), (19) and (20) above, wherein the component (D) is contained in an amount of 0.1 to 20 parts by mass per 100 parts by mass of the total amount of component (A').

The present invention has made it feasible to provide a positive photosensitive resin composition excelling in the sensitivity, film retention ratio and storage stability and a method of forming a cured film from the composition, especially a positive photosensitive resin composition from which a cured film excelling in the heat resistance, adherence, transmission, etc. can be obtained by curing thereof and a method of forming a cured film from the composition.

DETAILED DESCRIPTION OF THE INVENTION

The present invention will be described in detail below.
(A) Resin Component (Component (A))
The resin component (A) contained in the positive photosensitive resin composition of the present invention in its one form comprises a resin (also referred to as "component (A1)") containing any of structural units of general formula (1), which resin is insoluble in alkali or sparingly soluble in alkali but when its acid-dissociative group is dissociated, becomes soluble in alkali and a polymer or copolymer (also referred to as "component (A2)") containing a structural unit derived from a radical-polymerizable monomer containing an epoxy group. In its other form, the resin component (A) contains a resin (also referred to as "component (A')") containing not only any of structural units of general formula (1) but also a structural unit containing a functional group capable of reacting with a carboxyl group to thereby form a covalent bond, which resin is insoluble in alkali or sparingly soluble in alkali but when its acid-dissociative group is dissociated, becomes soluble in alkali.

First, the resin component (A) comprising component (A1) and component (A2) will be described.

The resin component (A) is characterized by containing component (A1) and component (A2) to be described in detail below. However, further, another resin may be contained in the resin component (A). Herein, the acid-dissociative group refers to a functional group that can be dissociated in the presence of an acid.

The polymer or copolymer, as component (A2), containing a structural unit derived from a radical-polymerizable monomer containing an epoxy group can further contain a structural unit containing any of structural units of general formula (1). The resultant resin is regarded as falling in the category of component (A2).

Component (A1)

The component (A1) refers to a resin containing any of structural units of general formula (1), which resin is insoluble in alkali or sparingly soluble in alkali but when its acid-dissociative group is dissociated, becomes soluble in alkali.

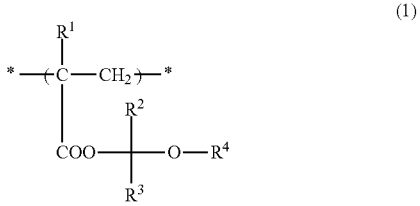

In general formula (1), $R^1$ represents a hydrogen atom, a methyl group, a halogen atom or a cyano group.

Each of $R^2$ and $R^3$ independently represents a hydrogen atom, or a linear or branched alkyl group, provided that $R^2$ and $R^3$ are not simultaneously hydrogen atoms.

$R^4$ represents an optionally substituted linear, branched or cyclic alkyl or aralkyl group.

$R^2$ and $R^4$ may be linked to each other to thereby form a cyclic ether.

In general formula (1), $R^1$ is preferably a hydrogen atom or a methyl group.

Each of $R^2$ and $R^3$ is preferably a linear or branched alkyl group having 1 to 6 carbon atoms.

$R^4$ is preferably an optionally substituted linear, branched or cyclic alkyl group having 1 to 10 carbon atoms. The substituent is preferably an alkoxy group having 1 to 5 carbon atoms or a halogen atom.

The aralkyl group represented by $R^4$ is preferably one having 7 to 10 carbon atoms.

When $R^2$ and $R^4$ are linked to each other to thereby form a cyclic ether, it is preferred for $R^2$ and $R^4$ to be linked to each other to thereby form an alkylene chain having 2 to 5 carbon atoms.

As the radical-polymerizable monomer employed for the formation of structural units of general formula (1), there can be mentioned, for example, a 1-alkoxyalkyl acrylate, a 1-alkoxyalkyl methacrylate, a 1-(haloalkoxy)alkyl acrylate, a 1-(haloalkoxy)alkyl methacrylate, a 1-(aralkyloxy)alkyl acrylate, a 1-(aralkyloxy)alkyl methacrylate, tetrahydropyranyl acrylate, tetrahydropyranyl methacrylate or the like. Of these, a 1-alkoxyalkyl acrylate, a 1-alkoxyalkyl methacrylate, tetrahydropyranyl acrylate and tetrahydropyranyl methacrylate are preferred. A 1-alkoxyalkyl acrylate and a 1-alkoxyalkyl methacrylate are especially preferred.

As specific examples of the radical-polymerizable monomers employed for the formation of structural units of general formula (1), there can be mentioned, for example, 1-ethoxyethyl methacrylate, 1-ethoxyethyl acrylate, 1-methoxyethyl methacrylate, 1-methoxyethyl acrylate, 1-n-butoxyethyl methacrylate, 1-n-butoxyethyl acrylate, 1-isobuotxyethyl methacrylate, 1-(2-chloroethoxy)ethyl methacrylate, 1-(2-ethylhexyloxy)ethyl methacrylate, 1-n-propoxyethyl methacrylate, 1-cyclohexyloxyethyl methacrylate, 1-(2-cyclohexylethoxy)ethyl methacrylate, 1-benzyloxyethyl methacrylate and the like. These may be used individually or in combination.

The radical-polymerizable monomers employed for the formation of structural units of general formula (1) may be commercially available products or those synthesized by heretofore known methods. For example, desirable monomers can be synthesized by causing a (meth)acrylic acid to react with a vinyl ether in the presence of an acid catalyst as shown below.

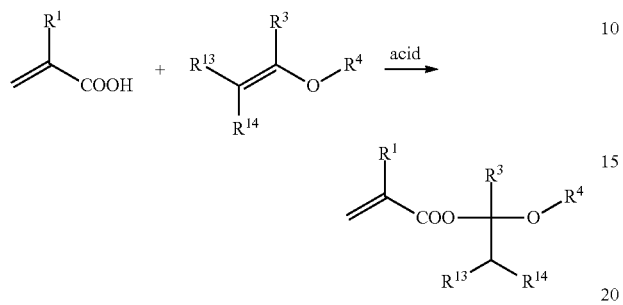

In the above formula, $R^1$, $R^3$ and $R^4$ correspond to the $R^1$, $R^3$ and $R^4$ of general formula (1). $R^{13}$ and $R^{14}$ in the form of —CH($R^{13}$)($R^{14}$) correspond to $R^2$ of general formula (1).

In the formation of component (A1), according to necessity, monomers for the formation of structural units of general formula (1) can be copolymerized with monomers for the formation of other structural units.

As the structural units other than those of general formula (1), there can be mentioned the structural units derived from styrene, tert-butoxystyrene, methylstyrene, hydroxystyrene, α-methylstyrene, acetoxystyrene, α-methylacetoxystyrene, methoxystyrene, ethoxystyrene, chlorostyrene, methyl vinylbenzoate, ethyl vinylbenzoate, acrylic acid, methacrylic acid, methyl acrylate, methyl methacrylate, ethyl acrylate, ethyl methacrylate, n-propyl acrylate, n-propyl methacrylate, isopropyl acrylate, isopropyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, benzyl acrylate, benzyl methacrylate, isobornyl acrylate, isobornyl methacrylate, glycidyl methacrylate, acrylonitrile and the like. These may be used individually or in combination.

The content of structural units of general formula (1) in the repeating units constituting the component (A1) is preferably in the range of 10 to 100 mol %, more preferably 20 to 90 mol % and most preferably 30 to 80 mol %.

The weight average molecular weight of the component (A1) in terms of polystyrene molecular weight is preferably in the range of 1000 to 200,000, more preferably 2000 to 50,000.

In the component (A1), use can be made of a mixture of two or more resins containing structural units different from each other, and also use can be made of a mixture of two or more resins containing structural units identical to each other which are however different from each other in ratios.

Various methods are known for the synthesis of the component (A1). For example, the synthesis can be accomplished by polymerizing a radical-polymerizable monomer mixture containing at least a radical-polymerizable monomer for use to form any of structural units of general formula (1) in an organic solvent in the presence of a radical polymerization initiator.

Component (A2)

The component (A2) refers to a polymer or copolymer containing a structural unit derived from a radical-polymerizable monomer containing an epoxy group.

It is preferred for the radical-polymerizable monomer containing an epoxy group to be any of the radical-polymerizable monomers of general formulae (3) to (5) below. The radical-polymerizable monomers can be used individually or in combination. The molecular weight of each of the radical-polymerizable monomers of general formulae (3) to (5) is preferably in the range of 100 to 500, more preferably 120 to 200.

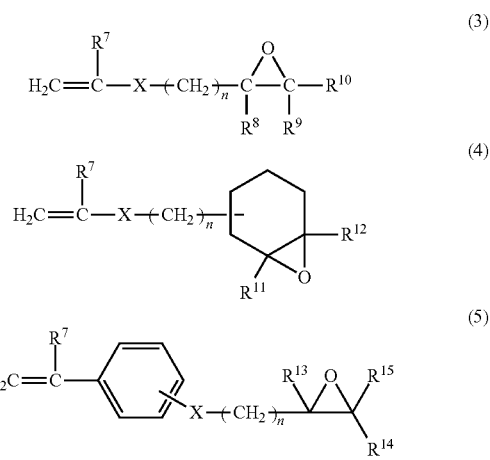

In general formulae (3) to (5), X represents a bivalent connecting group. As the bivalent connecting group, there can be mentioned, for example, —O—, —S— or an organic group, such as —COO— or —OCH$_2$COO—.

$R^7$ represents a hydrogen atom, a methyl group or a halogen atom. A hydrogen atom and a methyl group are preferred.

Each of $R^8$, $R^9$, $R^{10}$, $R^{11}$, $R^{12}$, $R^{13}$, $R^{14}$ and $R^{15}$ independently represents a hydrogen atom or an alkyl group, preferably a hydrogen atom or a methyl group.

n is an integer of 1 to 10.

As particular examples of the radical-polymerizable monomers containing an epoxy group, there can be mentioned (meth)acrylates, such as glycidyl acrylate, glycidyl methacrylate, 3,4-epoxybutyl acrylate, 3,4-epoxybutyl methacrylate, 4,5-epoxypentyl acrylate, 4,5-epoxypentyl methacrylate, 6,7-epoxyheptyl acrylate and 6,7-epoxyheptyl methacrylate; vinylbenzyl glycidyl ethers, such as o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether and α-methyl-p-vinylbenzyl glycidyl ether; p-vinylphenyl glycidyl ether, 3,4-epoxycyclohexylmethyl acrylate and 3,4-epoxycyclohexylmethyl methacrylate. Of these, glycidyl acrylate, glycidyl methacrylate, p-vinylphenyl glycidyl ether, 3,4-epoxycyclohexylmethyl acrylate and 3,4-epoxycyclohexylmethyl methacrylate are preferred. Glycidyl acrylate and glycidyl methacrylate are especially preferred.

The radical-polymerizable monomers containing an epoxy group may be commercially available products or those synthesized by heretofore known methods.

In the formation of component (A2), according to necessity, the radical-polymerizable monomers containing an epoxy group can be copolymerized with a monomer with a structural unit other than that of the radical-polymerizable monomer containing an epoxy group.

As the structural unit other than that of the radical-polymerizable monomer containing an epoxy group, there can be mentioned any of the structural units derived from styrene, tert-butoxystyrene, methylstyrene, hydroxystyrene, α-methylstyrene, acetoxystyrene, α-methylacetoxystyrene, methoxystyrene, ethoxystyrene, chlorostyrene, methyl vinylbenzoate, ethyl vinylbenzoate, acrylic acid, methacrylic acid, methyl acrylate, methyl methacrylate, ethyl acrylate, ethyl methacrylate, n-propyl acrylate, n-propyl methacrylate, isopropyl acrylate, isopropyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, benzyl acrylate, benzyl methacrylate, isobornyl acrylate, isobornyl methacrylate, glycidyl methacrylate, acrylonitrile and the like. Further, the radical-polymerizable monomer containing an epoxy group can be copolymerized with a "monomer capable of forming any of the structural units of general formula (1)."

These monomers may be used individually or in combination.

The content of structural units derived from the radical-polymerizable monomer containing an epoxy groups in the repeating units constituting the component (A2) is preferably in the range of 5 to 90 mol %, more preferably 10 to 80 mol % and most preferably 15 to 70 mol %.

The content of structural units of general formula (1) in the repeating units constituting the component (A2) is preferably in the range of 0 to 70 mol %, more preferably 5 to 50 mol %.

The weight average molecular weight of the component (A2) in terms of polystyrene molecular weight is preferably in the range of 1000 to 200,000, more preferably 2000 to 50,000.

In the component (A2), use can be made of a mixture of two or more resins containing structural units different from each other, and also use can be made of a mixture of two or more resins containing structural units identical to each other which are however different from each other in ratios.

Various methods are known for the synthesis of the component (A2) as well. For example, the synthesis can be accomplished by polymerizing a radical-polymerizable monomer mixture containing at least the radical-polymerizable monomer containing an epoxy group in an organic solvent in the presence of a radical polymerization initiator.

The mass ratio of component (A1) to component (A2) is preferably in the range of 20:80 to 80:20, more preferably 30:70 to 70:30.

The composition of the present invention may contain a resin other than the component (A1) and component (A2). The content of resin other than the component (A1) and component (A2) is preferably 50 parts by mass or less per 100 parts by mass of the sum of the component (A1) and component (A2).

Based on all the repeating units of all the resins constituting the component (A), the content of structural units of general formula (1) is preferably in the range of 10 to 90 mol %, more preferably 20 to 50 mol %.

The content of structural unit derived from the radical-polymerizable monomer containing an epoxy group is preferably in the range of 5 to 50 mol %, more preferably 10 to 40 mol %.

The total content of structural units other than the structural units of general formula (1) and those derived from the radical-polymerizable monomers containing an epoxy group is preferably 90 mol % or less, more preferably 60 mol % or less, based on all the repeating units of all the resins constituting the component (A).

Now, the resin component (A) in its other form will be described.

The positive photosensitive resin composition of the present invention in its other form, as the resin component (A), contains a resin (also referred to as component (A')) containing not only any of structural units of general formula (1) but also a structural unit containing a functional group capable of reacting with a carboxyl group to thereby form a covalent bond, which resin is insoluble in alkali or sparingly soluble in alkali but when its acid-dissociative group is dissociated, becomes soluble in alkali. The positive photosensitive resin composition of the present invention may further contain other resins. Herein, the acid-dissociative group refers to a functional group that can be dissociated in the presence of an acid.

General formula (1) is the same as the general formula (1) mentioned above in connection with the component (A1). In the present invention, a cured film is formed from the photosensitive composition through a process comprising the steps of applying the photosensitive composition to a substrate and drying the applied composition to thereby form a film; exposing the film through a mask to actinic rays; developing the exposed film with an alkali developer to thereby form a pattern, according to necessity followed by exposing the pattern on its entire surface; and baking the pattern. In the step of entire surface exposure or baking, an acid-dissociative group (—$C(R^2)(R^3)OR^4$) is dissociated from the structural units of general formula (1) of the component (A'), thereby forming a carboxyl group on a side chain of the component (A).

The expression "functional group capable of reacting with a carboxyl group to thereby form a covalent bond" in the structural unit containing a functional group capable of reacting with a carboxyl group to thereby form a covalent bond, to be contained in the component (A') of the present invention means the functional group capable of, as mentioned above, reacting upon baking with a carboxyl group generated on a side chain of the component (A') to thereby form a covalent bond.

A favorable cured film can be formed by the above formation upon baking of a covalent bond between the carboxyl group generated on a side chain of the component (A') and the "functional group capable of reacting with a carboxyl group to thereby form a covalent bond" contained in the component (A'), which formation realizes crosslinking.

As the functional group capable of reacting with a carboxyl group to thereby form a covalent bond, there can be mentioned, for example, an epoxy group, an oxetane group or the like. An epoxy group is especially preferred.

It is preferred for the structural unit containing the functional group capable of reacting with a carboxyl group to thereby form a covalent bond to be a structural unit containing an epoxy group as a functional group, formed from any of the radical-polymerizable monomers of any of general formulae (3) to (5) above. The molecular weight of each of the radical-polymerizable monomers of any of general formulae (3) to (5) is preferably in the range of 100 to 500, more preferably 120 to 200.

Particular examples of the radical-polymerizable monomers used for the formation of the structural unit containing an epoxy group as a functional group capable of reacting with a carboxyl group to thereby form a covalent bond can be the same as mentioned above in connection with the radical-polymerizable monomer containing an epoxy group of the component (A2). Preferred examples are also the same.

Structural units containing an oxetane group as the functional group can be formed from compounds derived by replacing with an oxetane group the epoxy group of any of the above particular examples containing an epoxy group as the functional group.

The radical-polymerizable monomers used for the formation of the structural unit containing a functional group capable of reacting with a carboxyl group to thereby form a covalent bond may be commercially available products or those synthesized by heretofore known methods.

The content of structural units of general formula (1) based on all the repeating units constituting the resin as the component (A') is preferably in the range of 10 to 90 mol %, more preferably 20 to 50 mol %.

The content of structural unit containing a functional group capable of reacting with a carboxyl group to thereby form a covalent bond, based on all the repeating units constituting the resin as the component (A'), is preferably in the range of 5 to 50 mol %, more preferably 10 to 40 mol %.

In the component (A'), according to necessity, a structural unit other than the structural units of general formula (1) and the structural unit containing a functional group capable of reacting with a carboxyl group to thereby form a covalent bond can be introduced by copolymerization.

Examples of the structural units other than the structural units of general formula (1) and the structural unit containing a functional group capable of reacting with a carboxyl group to thereby form a covalent bond are the same as mentioned above in connection with the structural units other than the structural units of general formula (1) with respect to the component (A1). The total content of such other structural units based on all the repeating units constituting the resin of the component (A) is preferably 90 mol % or less, more preferably 60 mol % or less.

The weight average molecular weight of the component (A') in terms of polystyrene molecular weight is preferably in the range of 1000 to 200,000, more preferably 2000 to 50,000.

In the component (A'), use can be made of a mixture of two or more resins containing structural units different from each other, and also use can be made of a mixture of two or more resins containing structural units identical to each other which are however different from each other in ratios.

Various methods are known for the synthesis of the component (A') as well. For example, the synthesis can be accomplished by polymerizing a radical-polymerizable monomer mixture, in which at least a radical-polymerizable monomer for the formation of any of the structural units of general formula (1) and a radical-polymerizable monomer for the formation of the structural unit containing a functional group capable of reacting with a carboxyl group to thereby form a covalent bond are contained, in an organic solvent in the presence of a radical polymerization initiator.

Hereinafter, the expression "component (A)" means not only the component (A) comprising components (A1) and (A2) but also the component (A) comprising component (A').

(B) Compound Containing Two or More Epoxy Groups in its Molecule

As particular examples of the compounds each containing two or more epoxy groups in its molecule (also referred to as "component (B)"), there can be mentioned a bisphenol A epoxy resin, a bisphenol F epoxy resin, a phenol novolak epoxy resin, a cresol novolak epoxy resin, an aliphatic epoxy resin and the like.

These are commercially available. For example, as the bisphenol A epoxy resins, there can be mentioned JER827, JER828, JER834, JER1001, JER1002, JER1003, JER1055, JER1007, JER1009 and JER1010 (all produced by Japan Epoxy Resin Co., Ltd.), EPICLON860, EPICLON1050, EPICLON1051 and EPICLON1055 (all produced by Dainippon Ink Chemicals, Inc.), and the like. As the bisphenol F epoxy resins, there can be mentioned, for example, JER806, JER807, JER4004, JER4005, JER4007 and JER4010 (all produced by Japan Epoxy Resin Co., Ltd.), EPICLON830 and EPICLON835 (both produced by Dainippon Ink Chemicals, Inc.), LCE-21 and RE-602S (both produced by Nippon Kayaku Co., Ltd.) and the like. As the phenol novolak epoxy resins, there can be mentioned JER152, JER154 and JER157S70 (all produced by Japan Epoxy Resin Co., Ltd.), EPICLON N-740, EPICLON N-770 and EPICLON N-775 (all produced by Dainippon Ink Chemicals, Inc.), and the like. As the cresol novolak epoxy resins, there can be mentioned EPICLON N-660, EPICLON N-665, EPICLON N-670, EPICLON N-673, EPICLON N-680, EPICLON N-690 and EPICLON N-695 (all produced by Dainippon Ink Chemicals, Inc.), EOCN-1020 (produced by Nippon Kayaku Co., Ltd.), and the like. As the aliphatic epoxy resins, there can be mentioned ADEKA RESINs EP-4080S, EP-4085S and EP-4088S (all produced by ADEKA Corporation), CELOXIDE2021P, CELOXIDE2081, CELOXIDE2083, CELOXIDE2085, EHPE3150 and EPOLEADs PB 3600 and PB4700 (all produced by Daicel Chemical Industries, Ltd.), and the like. Further, as commercially available epoxy resins, there can be mentioned ADEKA RESINs EP-4000S, EP-4003S, EP-4010S and EP-4011S (all produced by ADEKA Corporation), NC-2000, NC-3000, NC-7300, XD-1000, EPPN-501 and EPPN-502 (all produced by ADEKA Corporation), and the like. These epoxy resins can be used individually or in combination.

Of these epoxy resins, a bisphenol A epoxy resin, a bisphenol F epoxy resin, a phenol novolak epoxy resin and a cresol novolak epoxy resin are preferred. A bisphenol A epoxy resin is most preferred.

The content of epoxy resin (B) is preferably in the range of 1 to 50 parts by mass, more preferably 5 to 30 parts by mass, per 100 parts by mass of component (A).

The component (B) is effective for enhancing the adherence to a metal layer of chromium, molybdenum, aluminum, tantalum, titanium, copper, cobalt, tungsten, nickel, etc. The effect is striking when the metal layer is formed by a sputtering method.

(C) Compound that when Exposed to Actinic Rays of 300 nm or Longer Wavelength, Generates an Acid The compound that when exposed to actinic rays of 300 nm or longer wavelength, generates an acid (also referred to as "component (C)") for use in the present invention refers to a compound that is sensitive to actinic rays of 300 nm or longer wavelength, thereby generating an acid. This compound is not limited in the structure. The compound preferably generates an acid of 3 or below pKa, and the compound capable of generating a sulfonic acid is especially preferred. For example, there can be mentioned a sulfonium salt, an iodonium salt, a diazomethane compound, an imidosulfonate compound, an oxime sulfonate compound or the like. These compounds can be used individually or in combination.

Of these compounds, the compounds containing an oxime sulfonate group of general formula (2) below are preferred.

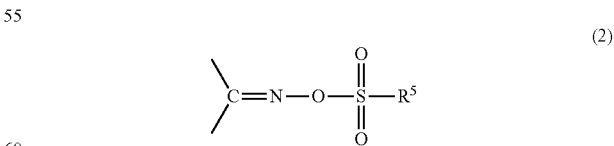

In general formula (2), $R^5$ represents an optionally substituted linear, branched or cyclic alkyl group or an optionally substituted aryl group.

The alkyl group represented by $R^5$ is preferably a linear or branched alkyl group having 1 to 10 carbon atoms. The alkyl group represented by $R^5$ may be substituted with any of $C_1$-$C_{10}$ alkoxy groups or alicyclic groups (including a bridged alicyclic group such as a 7,7-dimethyl-2-oxonorbornyl group, preferably a bicycloalkyl group or the like).

The aryl group represented by $R^5$ is preferably an aryl group having 6 to 11 carbon atoms, more preferably a phenyl group or a naphthyl group. The aryl group represented by $R^5$ may be substituted with an alkyl group having 1 to 5 carbon atoms, an alkoxy group or a halogen atom.

It is further preferred for the compounds containing an oxime sulfonate group of general formula (2) to be oxime sulfonate compounds of general formula (3) below.

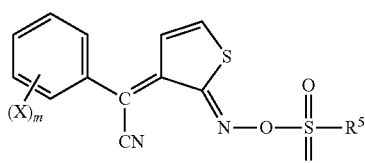
(3)

In general formula (3), $R^5$ is as defined above in connection with general formula (2).

X represents an alkyl group, an alkoxy group or a halogen atom, and m is an integer of 0 to 3, provided that when m is 2 or 3, a plurality of X's may be identical to or different from each other.

The alkyl group represented by X is preferably a linear or branched alkyl group having 1 to 4 carbon atoms.

The alkoxy group represented by X is preferably a linear or branched alkoxy group having 1 to 4 carbon atoms.

The halogen atom represented by X is preferably a chlorine atom or a fluorine atom.

Preferably, m is 0 or 1.

Compounds of general formula (3) in which m is 1, X is a methyl group and the X substitution takes place at the ortho position are especially preferred.

As particular examples of the oxime sulfonate compounds, there can be mentioned the following compound (i), compound (ii), compound (iii), compound (iv), compound (v) and the like. These compounds can be used individually or in combination. These compounds can also be used in combination with other types of components (C).

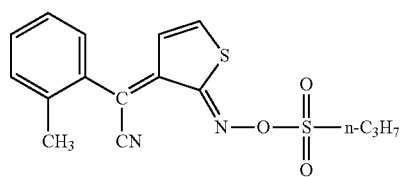
(i)

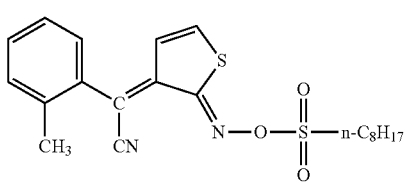
(ii)

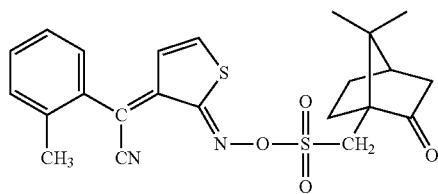
(iii)

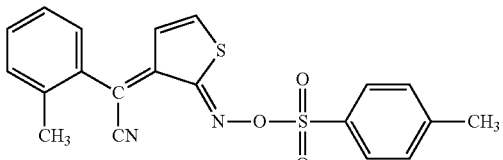
(iv)

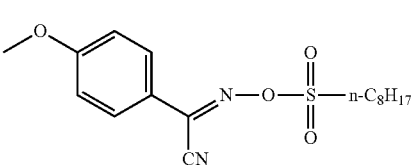
(v)

The compounds (i) to (v) are commercially available.

(D) Adhesion Aid

Further, the positive photosensitive resin composition of the present invention can contain an adhesion aid (D).

The adhesion aid (D) for use in the present invention is a compound that enhances the adherence between a substrate of an inorganic material, for example, a silicon compound such as silicon, silicon oxide or silicon nitride, or a metal such as gold, copper or aluminum, and an insulating film. As the adhesion aid, there can be mentioned, for example, a silane coupling agent, a thiol compound or the like.

The silane coupling agent as the adhesion aid for use in the present invention is added for the purpose of altering the properties of an interface, and heretofore known compounds can be used without particular limitation.

As preferred silane coupling agents, there can be mentioned, for example, γ-glycidoxypropyltrialkoxysilanes, γ-glycidoxypropylalkyldialkoxysilanes, γ-methacryloxypropyltrialkoxysilanes, γ-methacryloxypropylalkyldialkoxysilanes, γ-chloropropyltrialkoxysilanes, γ-mercaptopropyltrialkoxysilanes, β-(3,4-epoxycyclohexyl) ethyltrialkoxysilanes and vinyltrialkoxysilanes.

Of these, γ-glycidoxypropyltrialkoxysilanes and γ-methacryloxypropyltrialkoxysilanes are preferred, and γ-glycidoxypropyltrialkoxysilanes are more preferred.

These silane coupling agents can be used individually or in combination. These silane coupling agents are effective for not only enhancing the adherence to a substrate but also regulating the angle of taper to a substrate.

With respect to the mixing ratio of component (A), component (B), component (C) and component (D) in the positive photosensitive resin composition of the present invention, per 100 parts by mass of component (A), component (B) is preferably used in an amount of 1 to 50 parts by mass, more preferably 5 to 30 parts by mass, as mentioned above. Component (C) is preferably used in an amount of 0.1 to 10 parts by mass, more preferably 0.5 to 10 parts by mass. Component (D) is preferably used in an amount of 0.1 to 20 parts by mass, more preferably 0.5 to 10 parts by mass.

<Other Component>

In addition to the above component (A), component (B), component (C) and component (D), according to necessity, a basic compound, a surfactant, an ultraviolet absorber, a sensitizer, a plasticizer, a thickening agent, an organic solvent, an adhesion promotor, an organic or inorganic precipitation preventive, etc. can be added to the positive photosensitive resin composition of the present invention.

<Basic Compound>

As a basic compound, use can be made of any one arbitrarily selected from among those used in chemical amplification resists. As a basic compound, there can be mentioned, for example, an aliphatic amine, an aromatic amine, a heterocyclic amine, a quaternary ammonium hydroxide, a carboxylic acid quaternary ammonium salt or the like.

As the aliphatic amine, there can be mentioned, for example, trimethylamine, diethylamine, triethylamine, di-n-propylamine, tri-n-propylamine, di-n-pentylamine, tri-n-pentylamine, diethanolamine, triethanolamine, dicyclohexylamine, dicyclohexylmethylamine or the like.

As the aromatic amine, there can be mentioned, for example, aniline, benzylamine, N,N-dimethylaniline, diphenylamine or the like.

As the heterocyclic amine, there can be mentioned, for example, pyridine, 2-methylpyridine, 4-methylpyridine, 2-ethylpyridine, 4-ethylpyridine, 2-phenylpyridine, 4-phenylpyridine, N-methyl-4-phenylpyridine, 4-dimethylaminopyridine, imidazole, benzimidazole, 4-methylimidazole, 2-phenylbenzimidazole, 2,4,5-triphenylimidazole, nicotine, nicotinic acid, nicotinamide, quinoline, 8-oxyquinoline, pyrazine, pyrazole, pyridazine, purine, pyrrolidine, piperidine, piperazine, morpholine, 4-methylmorpholine, 1,5-diazabicyclo[4,3,0]-5-nonene, 1,8-diazabicyclo[5,3,0]-7-undecene or the like.

As the quaternary ammonium hydroxide, there can be mentioned, for example, tetramethylammonium hydroxide, tetraethylammonium hydroxide, tetra-n-butylammonium hydroxide, tetra-n-hexylammonium hydroxide or the like.

As the carboxylic acid quaternary ammonium salt, there can be mentioned, for example, tetramethylammonium acetate, tetramethylammonium benzoate, tetra-n-butylammonium acetate, tetra-n-butylammonium benzoate or the like.

With respect to the mixing ratio, the basic compound is preferably used in an amount of 0.001 to 1 part by mass, more preferably 0.005 to 0.2 part by mass, per 100 parts by mass of component (A).

<Surfactant>

Use can be made of any of anionic, cationic, nonionic and amphoteric surfactants. However, nonionic surfactants are preferred. As examples of nonionic surfactants, there can be mentioned polyoxyethylene higher alkyl ethers, polyoxyethylene higher alkyl phenyl ethers, higher fatty acid diesters of polyoxyethylene glycol, silicones and fluorinated surfactants. Further, there can be mentioned a series of each of products commercially available under the following trade names: KP (produced by Shin-Etsu Chemical Co., Ltd.), Polyflow (produced by Kyoeisha Chemical Co., Ltd.), Eftop (produced by JEMCO INC.), Megafac (produced by Dainippon Ink & Chemicals, Inc.), Florad (produced by Sumitomo 3M Ltd.), Asahi Guard and Surflon (produced by Asahi Glass Co., Ltd.), PolyFox (produced by OMNOVA SOLUTIONS, INC.), etc.

These surfactants can be used individually or in combination.

With respect to the mixing ratio, the surfactant is generally used in an amount of 10 parts by mass or less, preferably 0.01 to 10 parts by mass and more preferably 0.01 to 1 part by mass, per 100 parts by mass of component (A).

<Plasticizer>

As the plasticizer, there can be mentioned, for example, dibutyl phthalate, dioctyl phthalate, didodecyl phthalate, polyethylene glycol, glycerol, dimethylglycerol phthalate, dibutyl tartrate, dioctyl adipate, triacetylglycerol or the like.

With respect to the mixing ratio, the plasticizer is preferably used in an amount of 0.1 to 30 parts by mass, more preferably 1 to 10 parts by mass, per 100 parts by mass of component (A).

<Solvent>

The positive photosensitive composition of the present invention is used in the form of a solution prepared by dissolving the above components in a solvent. As the solvents for use in the positive photosensitive composition of the present invention, there can be mentioned, for example, (a) ethylene glycol monoalkyl ethers, such as ethylene glycol monomethyl ether, ethylene glycol monoethyl ether, ethylene glycol monopropyl ether and ethylene glycol monobutyl ether;

(b) ethylene glycol dialkyl ethers, such as ethylene glycol dimethyl ether, ethylene glycol diethyl ether and ethylene glycol dipropyl ether;

(c) ethylene glycol monoalkyl ether acetates, such as ethylene glycol monomethyl ether acetate, ethylene glycol monoethyl ether acetate, ethylene glycol monopropyl ether acetate and ethylene glycol monobutyl ether acetate;

(d) propylene glycol monoalkyl ethers, such as propylene glycol monomethyl ether, propylene glycol monoethyl ether, propylene glycol monopropyl ether and propylene glycol monobutyl ether;

(e) propylene glycol dialkyl ethers, such as propylene glycol dimethyl ether and propylene glycol diethyl ether;

(f) propylene glycol monoalkyl ether acetates, such as propylene glycol monomethyl ether acetate, propylene glycol monoethyl ether acetate, propylene glycol monopropyl ether acetate and propylene glycol monobutyl ether acetate;

(g) diethylene glycol dialkyl ethers, such as diethylene glycol dimethyl ether, diethylene glycol diethyl ether and diethylene glycol ethyl methyl ether;

(h) diethylene glycol monoalkyl ether acetates, such as diethylene glycol monomethyl ether acetate, diethylene glycol monoethyl ether acetate, diethylene glycol monopropyl ether acetate and diethylene glycol monobutyl ether acetate;

(i) dipropylene glycol monoalkyl ethers, such as dipropylene glycol monomethyl ether, dipropylene glycol monoethyl ether, dipropylene glycol monopropyl ether and dipropylene glycol monobutyl ether;

(j) dipropylene glycol dialkyl ethers, such as dipropylene glycol dimethyl ether, dipropylene glycol diethyl ether and dipropylene glycol ethyl methyl ether;

(k) dipropylene glycol monoalkyl ether acetates, such as dipropylene glycol monomethyl ether acetate, dipropylene glycol monoethyl ether acetate, dipropylene glycol monopropyl ether acetate and dipropylene glycol monobutyl ether acetate;

(l) lactic esters, such as methyl lactate, ethyl lactate, n-propyl lactate, isopropyl lactate, n-butyl lactate, isobutyl lactate, n-amyl lactate and isoamyl lactate;

(m) aliphatic carboxylic esters, such as n-butyl acetate, isobutyl acetate, n-amyl acetate, isoamyl acetate, n-hexyl acetate, 2-ethylhexyl acetate, ethyl propionate, n-propyl propionate, isopropyl propionate, n-butyl propionate, isobutyl propionate, methyl butyrate, ethyl butyrate, n-propyl butyrate, isopropyl butyrate, n-butyl butyrate and isobutyl butyrate;

(n) esters, such as ethyl hydroxyacetate, ethyl 2-hydroxy-2-methylpropionate, ethyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxybutyl acetate, 3-methyl-3-methoxybutyl acetate, 3-methyl-3-methoxybutyl propionate, 3-methyl-3-methoxybutyl butyrate, methyl acetoacetate, ethyl acetoacetate, methyl pyruvate and ethyl pyruvate;

(o) ketones, such as methyl ethyl ketone, methyl propyl ketone, methyl n-butyl ketone, methyl isobutyl ketone, 2-heptanone, 3-heptanone, 4-heptanone and cyclohexanone;

(p) amides, such as N-methylformamide, N,N-dimethylformamide, N-methylacetamide, N,N-dimethylacetamide and N-methylpyrrolidone; and (q) lactones, such as γ-butyrolactone.

Further, according to necessity, other solvents can be added to these solvents, which other solvents are, for example, benzyl ethyl ether, dihexyl ether, ethylene glycol monophenyl ether acetate, diethylene glycol monomethyl ether, diethylene glycol monoethyl ether, isophorone, caproic acid, caprylic acid, 1-octanol, 1-nonanol, benzyl alcohol, anisole, benzyl acetate, ethyl benzoate, diethyl oxalate, diethyl maleate, ethylene carbonate, propylene carbonate and the like.

These solvents can be used individually or in combination.

With respect to the mixing ratio, the solvent is generally used in an amount of 50 to 3000 parts by mass, preferably 100 to 2000 parts by mass and more preferably 100 to 500 parts by mass, per 100 parts by mass of component (A).

The present invention provides a positive photosensitive resin composition excelling in the sensitivity, film retention ratio and aging stability, from which a cured film excelling in the heat resistance, adherence, transmission, etc. can be obtained by curing thereof.

<Method of Forming Cured Film>

Below, a method of forming a cured film using the positive photosensitive resin composition of the present invention will be described.

First, the positive photosensitive resin composition of the present invention is applied to a substrate and baked to thereby form a film on the substrate.

The formed film is exposed to actinic rays of 300 nm or longer wavelength, so that the component (C) is decomposed to thereby generate an acid. By the catalytic action of the generated acid, the acid-dissociative group of the structural units of general formula (1) contained in the component (A1) or component (A') is dissociated through a hydrolytic reaction, thereby producing a carboxyl group. In the development of the exposed film using an alkali developer, the exposed areas containing the resin with a carboxyl group that can easily be dissolved in the alkali developer are removed, thereby forming a positive image.

The formula of this hydrolytic reaction is as follows.

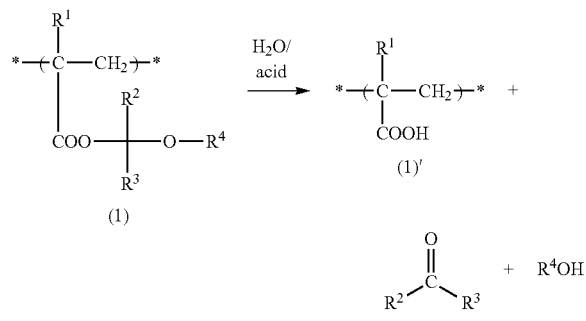

In order to accelerate this hydrolytic reaction, according to necessity, post-exposure bake (hereinafter referred to as PEB) can be carried out. However, when the bake temperature is extremely high, the generated carboxyl group would induce a crosslinking reaction with the epoxy group to thereby render the development impracticable.

Actually, when tert-butyl methacrylate is used in place of the repeating units of general formula (1), the activation energy for acid dissociation reaction is so high that for the dissociation of the acid-dissociative group, PEB must be performed at high temperature, thereby causing a crosslinking reaction to simultaneously occur with the result that no image can be obtained.

In contrast, in the use of any of the acid-dissociative groups of general formula (1) according to the present invention, the activation energy for acid decomposition is so low that the acid-dissociative group is easily decomposed by the acid derived from an acid generator upon exposure to thereby generate a carboxyl group with the result that without the need to carry out PEB, a positive image can be formed by development.

However, PEB may be carried out at relatively low temperatures so as to accelerate the decomposition of the acid-dissociative group without inviting any crosslinking reaction.

The PEB temperature is preferably 130° C. or below, more preferably 110° C. or below and most preferably 80° C. or below.

Subsequently, the obtained positive image is baked, so that the acid-dissociative group of general formula (1) is decomposed by heat to thereby generate a carboxyl group and cause the carboxyl group to crosslink with an epoxy group. Thus, a cured film can be formed. The baking is preferably carried out at a high temperature of 150° C. or above, more preferably 80 to 250° C. and most preferably 200 to 250° C.

The baking time can be appropriately set depending on the baking temperature, etc. The baking time generally ranges from 10 to 90 minutes.

When the operation of exposing the entire surface to actinic rays is added before the baking operation, the crosslinking reaction can be promoted by the acid generated by the exposure to actinic rays.

The method of forming a cured film from the positive photosensitive resin composition of the present invention will be described in detail below.

Method of preparing a composition solution: The component (A), component (B), component (C) and other additives are mixed together in a given proportion by any arbitrary method, followed by agitation and dissolution. Thus, a composition solution is obtained. For example, a composition solution can be obtained by dissolving individual components in solvents into solutions in advance and mixing together the solutions in a given proportion. The thus obtained composition solution can be passed through a filter of 0.2 μm pore diameter or the like before use thereof.

<Method of Forming Film>

A desired film can be formed by applying the composition solution to a given substrate and baking the applied solution so as to remove the solvent (hereinafter referred to as prebake). In the production of, for example, a liquid crystal display device, the substrate may be, for example, a glass substrate provided with a deflecting sheet, further according to necessity a black matrix layer and a color filter layer, and furthermore with a transparent conductive circuit layer. The method of applying the solution to the substrate is not particularly limited. For example, use can be made of a spray method, a roll coating method, a spin coating method or the like.

The heating condition at prebake is selected so as to fall within the range in which in unexposed areas, the component (A) is not rendered soluble in an alkali developer by the dissociation of the acid-dissociative group contained in, for example, the repeating units of general formula (1) of the component (A). Although the heating condition depends on the types and mixing ratio of individual components, it is on the order of 80 to 130° C. and 30 to 120 seconds.

<Method of Forming Pattern>

The substrate provided with the film is exposed through a mask of given pattern to actinic rays, optionally baked (PEB), and developed with a developer to thereby remove exposed areas. Thus, an image pattern is formed.

In the irradiation with actinic rays, use can be made of a low pressure mercury lamp, a high pressure mercury lamp, an ultrahigh pressure mercury lamp, a chemical lamp, an excimer laser generating system or the like. Actinic rays of 300 nm or longer wavelength, such as g-rays, i-rays or h-rays, are preferred. According to necessity, the exposure light can be regulated through a spectral filter, such as a long wavelength cut filter, a short wavelength cut filter or a band pass filter.

As the developer, use can be made of, for example, an aqueous solution of any of alkali metal hydroxides, such as lithium hydroxide, sodium hydroxide and potassium hydroxide; alkali metal carbonates, such as sodium carbonate and potassium carbonate; alkali metal bicarbonates, such as sodium bicarbonate and potassium bicarbonate; ammonium hydroxides, such as tetramethylammonium hydroxide, tetraethylammonium hydroxide and choline hydroxide; and sodium silicate and sodium metasilicate. Also, as the developer, use can be made of an aqueous solution as obtained by adding appropriate amounts of a water-soluble organic solvent, such as methanol or ethanol, and a surfactant to any of the above alkali aqueous solutions.

The pH value of the developer is preferably in the range of 10.0 to 14.0.

The development time is generally in the range of 30 to 180 seconds. The development can be performed by any of a puddle method, a dip method and the like. After the development, rinse with running water is performed for 30 to 90 seconds. Thus, a desired pattern can be obtained.

<Crosslinking Step>

The pattern with unexposed areas obtained by the development is baked by means of a heater, such as a hot plate or an oven, at a given temperature, for example, 180 to 250° C. for a given period of time, for example, 5 to 30 minutes on a hot plate and 30 to 90 minutes in an oven. Thus, for example, the acid-dissociative group of component (A1) is cleaved, thereby generating a carboxyl group, and the carboxyl group is allowed to react with the structure capable of crosslinking with a carboxyl group of component (A2), thereby forming a crosslink. Thus, a protective film or interlayer insulating film excelling in heat resistance, hardness, etc. can be formed. The transparency thereof can be enhanced by performing the baking in a nitrogen atmosphere.

Prior to the baking, the patternized substrate is preferably exposed to actinic rays to thereby cause the component (C) being present in unexposed areas to generate an acid.

EXAMPLE

The present invention will be described in greater detail below by way of its examples. However, the present invention is in no way limited to these examples.

1. Example I

Synthetic Example 1

Synthesis of Polymer A1-1

A 500 ml three-necked flask was charged with 67.1 g (0.36 mol) of 1-n-butoxyethyl methacrylate, 21.1 g (0.12 mol) of benzyl methacrylate, 10.3 g (0.12 mol) of methacrylic acid and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in propylene glycol monomethyl ether acetate. The heptane and methyl isobutyl ketone contained in the solution were distilled off in vacuum, thereby obtaining a propylene glycol monomethyl ether acetate solution of polymer A1-1 (1-n-butoxyethyl methacrylate/benzyl methacrylate/methacrylic acid).

The molecular weight and molecular weight distribution of the obtained polymer were determined by GPC measurement using polystyrene as a standard. It was found that the weight average molecular weight of the polymer was about 8000 and the molecular weight distribution (Mw/Mn) thereof was 1.8.

Synthetic Example 2

Synthesis of Polymer A1-2

A 500 ml three-necked flask was charged with 105.7 g (0.48 mol) of 1-benzyloxyethyl methacrylate, 7.8 g (0.06 mol) of 2-hydroxyethyl methacrylate, 5.2 g (0.06 mol) of methacrylic acid and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol dimethyl ether. The heptane and methyl isobutyl ketone contained in the solution were distilled off in vacuum, thereby obtaining a diethylene glycol dimethyl ether solution of polymer A1-2 (1-benzyloxyethyl methacrylate/2-hydroxyethyl methacrylate/methacrylic acid).

The molecular weight and molecular weight distribution of the obtained polymer were determined by GPC measurement using polystyrene as a standard. It was found that the weight average molecular weight of the polymer was about 4000 and the molecular weight distribution (Mw/Mn) thereof was 1.6.

Synthetic Example 3

Synthesis of polymer A1-3

A 500 ml three-necked flask was charged with 66.4 g (0.42 mol) of 1-ethoxyethyl methacrylate, 21.1 g (0.12 mol) of benzyl methacrylate, 7.8 g (0.06 mol) of 2-hydroxyethyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol ethyl methyl ether. The heptane and methyl isobutyl ketone contained in the solution were distilled off in vacuum, thereby obtaining a diethylene glycol ethyl methyl ether solution of polymer A1-3 (1-ethoxyethyl methacrylate/benzyl methacrylate/2-hydroxyethyl methacrylate).

The molecular weight and molecular weight distribution of the obtained polymer were determined by GPC measurement using polystyrene as a standard. It was found that the weight average molecular weight of the polymer was about 4000 and the molecular weight distribution (Mw/Mn) thereof was 1.6.

Synthetic Example 4

Synthesis of Polymer A1-4

A 500 ml three-necked flask was charged with 51.9 g (0.36 mol) of 1-ethoxyethyl acrylate, 31.7 g (0.18 mol) of benzyl methacrylate, 7.8 g (0.06 mol) of 2-hydroxyethyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in propylene glycol monomethyl ether acetate. The heptane and methyl isobutyl ketone contained in the solution were distilled off in vacuum, thereby obtaining a propylene glycol monomethyl ether acetate solution of polymer A1-4 (1-ethoxyethyl acrylate/benzyl methacrylate/2-hydroxyethyl methacrylate).

The molecular weight and molecular weight distribution of the obtained polymer were determined by GPC measurement using polystyrene as a standard. It was found that the weight average molecular weight of the polymer was about 5000 and the molecular weight distribution (Mw/Mn) thereof was 1.7.

Synthetic Example 5

Synthesis of Polymer A1-5

A 500 ml three-necked flask was charged with 28.5 g (0.18 mol) of 1-ethoxyethyl methacrylate, 52.9 g (0.30 mol) of benzyl methacrylate, 10.3 g (0.12 mol) of methacrylic acid and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol dimethyl ether. The heptane and methyl isobutyl ketone contained in the solution were distilled off in vacuum, thereby obtaining a diethylene glycol dimethyl ether solution of polymer A1-5 (1-ethoxyethyl methacrylate/benzyl methacrylate/methacrylic acid).

The molecular weight and molecular weight distribution of the obtained polymer were determined by GPC measurement using polystyrene as a standard. It was found that the weight average molecular weight of the polymer was about 12000 and the molecular weight distribution (Mw/Mn) thereof was 1.8.

Synthetic Example 6

Synthesis of Polymer A1-6

A 500 ml three-necked flask was charged with 63.7 g (0.30 mol) of 1-cyclohexyloxyethyl methacrylate, 40.3 g (0.30 mol) of p-methoxystyrene and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol ethyl methyl ether. The heptane and methyl isobutyl ketone contained in the solution were distilled off in vacuum, thereby obtaining a diethylene glycol ethyl methyl ether solution of polymer A1-6 (1-cyclohexyloxyethyl methacrylate/p-methoxystyrene).

The molecular weight and molecular weight distribution of the obtained polymer were determined by GPC measurement using polystyrene as a standard. It was found that the weight average molecular weight of the polymer was about 8000 and the molecular weight distribution (Mw/Mn) thereof was 1.7.

Synthetic Example 7

Synthesis of Polymer A1-7

A 500 ml three-necked flask was charged with 71.5 g (0.42 mol) of 2-tetrahydropyranyl methacrylate, 19.5 g (0.12 mol) of p-acetoxystyrene, 7.8 g (0.06 mol) of 2-hydroxyethyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in mixed solvent of propylene glycol monomethyl ether acetate and diethylene glycol ethyl methyl ether. The heptane and methyl isobutyl ketone contained in the solution were distilled off in vacuum, thereby obtaining polymer A1-7 (2-tetrahydropyranyl methacrylate/p-acetoxystyrene/2-hydroxyethyl methacrylate) dissolved in mixed solvent of propylene glycol monomethyl ether acetate and diethylene glycol ethyl methyl ether.

The molecular weight and molecular weight distribution of the obtained polymer were determined by GPC measurement using polystyrene as a standard. It was found that the weight average molecular weight of the polymer was about 6000 and the molecular weight distribution (Mw/Mn) thereof was 1.7.

Synthetic Example 8

Synthesis of Polymer A2-1

A 500 ml three-necked flask was charged with 51.2 g (0.36 mol) of glycidyl methacrylate, 42.3 g (0.24 mol) of benzyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in propylene glycol monomethyl ether acetate. The heptane and methyl isobutyl ketone contained in the solution were distilled off in vacuum, thereby obtaining a propylene glycol monomethyl ether acetate solution of polymer A2-1 (glycidyl methacrylate/benzyl methacrylate).

The molecular weight and molecular weight distribution of the obtained polymer were determined by GPC measurement using polystyrene as a standard. It was found that the weight average molecular weight of the polymer was about 8000 and the molecular weight distribution (Mw/Mn) thereof was 1.7.

Synthetic Example 9

Synthesis of Polymer A2-2

A 500 ml three-necked flask was charged with 46.1 g (0.36 mol) of glycidyl acrylate, 15.6 g (0.12 mol) of 2-hydroxyethyl methacrylate, 19.5 g (0.12 mol) of p-acetoxystyrene and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol dimethyl ether. The heptane and methyl isobutyl ketone contained in the solution were distilled off in vacuum, thereby obtaining a diethylene glycol dimethyl ether solution of polymer A2-2 (glycidyl acrylate/2-hydroxyethyl methacrylate/p-acetoxystyrene).

The molecular weight and molecular weight distribution of the obtained polymer were determined by GPC measurement using polystyrene as a standard. It was found that the weight average molecular weight of the polymer was about 5000 and the molecular weight distribution (Mw/Mn) thereof was 1.6.

Synthetic Example 10

Synthesis of Polymer A2-3

A 500 ml three-necked flask was charged with 58.9 g (0.30 mol) of 3,4-epoxycyclohexylmethyl methacrylate (Cyclomer M100 produced by Daicel Chemical Industries, Ltd.), 31.7 g (0.18 mol) of benzyl methacrylate, 10.3 g (0.12 mol) of methacrylic acid and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol ethyl methyl ether. The heptane and methyl isobutyl ketone contained in the solution were distilled off in vacuum, thereby obtaining a diethylene glycol ethyl methyl ether solution of polymer A2-3 (3,4-epoxycyclohexylmethyl methacrylate/benzyl methacrylate/methacrylic acid).

The molecular weight and molecular weight distribution of the obtained polymer were determined by GPC measurement using polystyrene as a standard. It was found that the weight average molecular weight of the polymer was about 7000 and the molecular weight distribution (Mw/Mn) thereof was 1.7.

Synthetic Example 11

Synthesis of Polymer A2-4

A 500 ml three-necked flask was charged with 52.9 g (0.30 mol) of p-vinylphenyl glycidyl ether, 19.0 g (0.12 mol) of 1-ethoxyethyl methacrylate, 29.2 g (0.18 mol) of p-acetoxystyrene and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in propylene glycol monomethyl ether acetate. The heptane and methyl isobutyl ketone contained in the solution were distilled off in vacuum, thereby obtaining a propylene glycol monomethyl ether acetate solution of polymer A2-4 (p-vinylphenyl glycidyl ether/1-ethoxyethyl methacrylate/p-acetoxystyrene).

The molecular weight and molecular weight distribution of the obtained polymer were determined by GPC measurement using polystyrene as a standard. It was found that the weight average molecular weight of the polymer was about 4000 and the molecular weight distribution (Mw/Mn) thereof was 1.6.

Synthetic Example 12

Synthesis of Polymer A2-5

A 500 ml three-necked flask was charged with 34.1 g (0.24 mol) of glycidyl methacrylate, 38.0 g (0.24 mol) of 1-ethoxyethyl methacrylate, 15.6 g (0.12 mol) of 2-hydroxyethyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol dimethyl ether. The heptane and methyl isobutyl ketone contained in the solution were distilled off in vacuum, thereby obtaining a diethylene glycol dimethyl ether solution of polymer A2-5 (glycidyl methacrylate/1-ethoxyethyl methacrylate/2-hydroxyethyl methacrylate).

The molecular weight and molecular weight distribution of the obtained polymer were determined by GPC measurement using polystyrene as a standard. It was found that the weight average molecular weight of the polymer was about 9000 and the molecular weight distribution (Mw/Mn) thereof was 1.7.

Synthetic Example 13

Synthesis of Polymer A2-6

A 500 ml three-necked flask was charged with 34.1 g (0.24 mol) of glycidyl methacrylate, 28.5 g (0.18 mol) of 1-ethoxyethyl methacrylate, 7.8 g (0.06 mol) of 2-hydroxyethyl methacrylate, 21.1 g (0.12 mol) of benzyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol ethyl methyl ether. The heptane and methyl isobutyl ketone contained in the solution were distilled off in vacuum, thereby obtaining a diethylene glycol ethyl methyl ether solution of polymer A2-6 (glycidyl methacrylate/1-ethoxyethyl methacrylate/2-hydroxyethyl methacrylate/benzyl methacrylate).

The molecular weight and molecular weight distribution of the obtained polymer were determined by GPC measurement using polystyrene as a standard. It was found that the weight average molecular weight of the polymer was about 8000 and the molecular weight distribution (Mw/Mn) thereof was 1.7.

Synthetic Example 14

Synthesis of Polymer A2-7

A 500 ml three-necked flask was charged with 51.2 g (0.36 mol) of glycidyl methacrylate, 21.1 g (0.12 mol) of benzyl methacrylate, 10.3 g (0.12 mol) of methacrylic acid and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol ethyl methyl ether. The heptane and methyl isobutyl ketone contained in the solution were distilled off in vacuum, thereby obtaining a diethylene glycol ethyl methyl ether solution of polymer A2-7 (glycidyl methacrylate/benzyl methacrylate/methacrylic acid).

The molecular weight and molecular weight distribution of the obtained polymer were determined by GPC measurement using polystyrene as a standard. It was found that the weight average molecular weight of the polymer was about 4000 and the molecular weight distribution (Mw/Mn) thereof was 1.6.

Comparative Synthetic Example 1

Synthesis of Polymer A'1-8

A 500 ml three-necked flask was charged with 51.2 g (0.36 mol) of tert-butyl methacrylate, 21.1 g (0.12 mol) of benzyl methacrylate, 10.3 g (0.12 mol) of methacrylic acid and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in propylene glycol monomethyl ether acetate. The heptane and methyl isobutyl ketone contained in the solution were distilled off in vacuum, thereby obtaining a propylene glycol monomethyl ether acetate solution of polymer A'1-8 (tert-butyl methacrylate/benzyl methacrylate/methacrylic acid).

The molecular weight and molecular weight distribution of the obtained polymer were determined by GPC measurement using polystyrene as a standard. It was found that the weight average molecular weight of the polymer was about 8000 and the molecular weight distribution (Mw/Mn) thereof was 1.6.

Comparative Synthetic Example 2

Synthesis of Polymer A'1-9

A 500 ml three-necked flask was charged with 72.1 g of poly-4-hydroxystyrene (VP-8000 produced by Nippon Soda Co., Ltd.), 16.4 g of ethyl vinyl ether and 300 ml of ethyl acetate. A catalytic amount of paratoluenesulfonic acid was added to the mixture, and reaction was performed in a nitrogen stream at room temperature for three hours. A small amount of triethylamine was added, and washing was performed with pure water. Propylene glycol monomethyl ether acetate was added to the ethyl acetate phase, and ethyl acetate was distilled off in vacuum, thereby obtaining a propylene glycol monomethyl ether acetate solution of polymer A'1-9 (p-1-ethoxyethoxystyrene/p-hydroxystyrene).

In the obtained polymer, it was found by NMR measurement that the ratio between p-1-ethoxyethoxystyrene units and p-hydroxystyrene units was about 35:65. Further, as a result of GPC measurement using polystyrene as a standard, it was found that the weight average molecular weight of the obtained polymer was about 9000 and the molecular weight distribution (Mw/Mn) thereof was 1.2.

Comparative Synthetic Example 3

Synthesis of Polymer A'-10

Polymer A'-10 was synthesized in accordance with Synthetic Example 1 of JP-A-2004-264623.

A three-necked flask was charged with 7 parts by mass of 2,2'-azobis(2,4-dimethylvaleronitrile) and 200 parts by mass of diethylene glycol ethyl methyl ether, and further charged with 40 parts by mass of 1-(cyclohexyloxy)ethyl methacrylate, 5 parts by mass of styrene, 45 parts by mass of glycidyl methacrylate, 10 parts by mass of 2-hydroxyethyl methacrylate and 3 parts by mass of α-methylstyrene dimer. The interior of the flask was flushed with nitrogen, and gentle agitation was started. The solution was heated to 70° C., and this temperature was maintained for five hours, thereby obtaining a polymer solution containing copolymer A'-10. As a result of GPC measurement using polystyrene as a standard, it was found that the weight average molecular weight of the obtained polymer was about 11,000 and the molecular weight distribution (Mw/Mn) thereof was 1.9.

Examples 1 to 7 and Comparative Examples 1 to 4

(1) Preparation of Solution of Positive Photosensitive Resin Composition

Components of Table 1 below were mixed together, thereby obtaining homogeneous solutions. These solutions were each passed through a polytetrafluoroethylene filer of 0.2 μm pore size, thereby obtaining solutions of positive photosensitive resin composition.

(2) Evaluation of Storage Stability

The viscosity at 23° C. of each of the positive photosensitive resin composition solutions was measured by means of an E-type viscometer manufactured by Toki Sangyo Co., Ltd. Each of the compositions was stored in a thermostated vessel at 23° C. for a month, and the viscosity thereof after the storage was measured. When the viscosity increase measured upon the storage at room temperature for a month relative to the viscosity upon the preparation of the composition was less than 5%, the evaluation mark o was given. When the viscosity increase was 5% or greater, the evaluation mark x was given. The results are shown in Table 2 below.

(3) Evaluation of Sensitivity and Film Retention Ratio at Development

Each of the solutions of positive photosensitive resin composition was applied by spin coating onto a silicon wafer with a silicon oxide film, and prebaked on a hot plate at 100° C. for 60 seconds, thereby forming a film of 3 μm thickness.

Subsequently, each of the films was exposed through a given mask by means of an i-ray stepper (FPA-3000i5+ manufactured by Canon Inc.). The exposed film was baked at 50° C. for 60 seconds, developed with an alkali developer indicated in Table 2 (2.38 mass % or 0.4 mass % aqueous tetramethylammonium hydroxide solution) at 23° C. for 60 seconds, and rinsed with ultrapure water for a minute. The sensitivity was defined as the optimum exposure amount (Eopt) in which a 5 μm 1:1 line and space pattern was resolved in this operation.

The film retention ratio at development was evaluated by measuring the film thickness in unexposed areas after development and calculating the ratio thereof to the film thickness upon application ([film thickness in unexposed areas after development]/[film thickness upon application]×100(%)).

The evaluation results on the sensitivity and film retention ratio at development are given in Table 2.

(4) Heat Resistance

Films were formed in the same manner as in evaluation (3) above except that a transparent substrate (Corning 1737 manufactured by Corning Incorporated) was used in place of the silicon wafer with a silicon oxide film. Each of the films was exposed through an adhering given mask to ultraviolet rays whose intensity at 365 nm was 18 mW/cm² by means of a proximity exposure apparatus (UX-1000SM manufactured by Ushio Inc.). Subsequently, the exposed film was developed with an alkali developer indicated in Table 2 (2.38 mass % or 0.4 mass % aqueous tetramethylammonium hydroxide solution) at 23° C. for 60 seconds, and rinsed with ultrapure water for 10 seconds. A 10 nm 1:1 line and space pattern was formed by this operation. The entire surface of the obtained pattern was further exposed for 100 seconds, and the further exposed pattern was baked in an oven at 220° C. for an hour. Thus, a thermally cured film was formed on the glass substrate.

The heat resistance was evaluated by measuring the ratio of change of bottom dimension by thermal curing, namely, (1−[bottom dimension of thermally cured film]/[bottom dimension after development])×100(%). When the change ratio was below 5%, the evaluation mark o was given. When the change ratio was 5% or higher, the evaluation mark x was given.

The evaluation results on the heat resistance are given in Table 2.

(5) Transmission and Adherence

Films were formed in the same manner as in evaluation (4) above. Each of the films without being exposed was developed with an alkali developer indicated in Table 2 (2.38 mass % or 0.4 mass % aqueous tetramethylammonium hydroxide solution) at 23° C. for 60 seconds, and rinsed with ultrapure water for 10 seconds. Subsequently, the entire surface of the developed and rinsed film was exposed to ultraviolet rays whose intensity at 365 nm was 18 mW/cm² for 100 seconds by means of a proximity exposure apparatus (UX-1000SM manufactured by Ushio Inc.). The thus exposed film was baked in an oven at 220° C. for an hour. Thus, a thermally cured film was formed on the glass substrate.

The transmission of each of the resultant thermally cured films was measured at a wavelength of 400 to 800 nm by means of a spectrophotometer (U-3000 manufactured by Hitachi, Ltd.). When the minimum transmission exceeded 95%, the evaluation mark o was given. When the minimum transmission fell in the range of 90 to 95%, the evaluation mark Δ was given. When the minimum transmission was less than 90%, the evaluation mark x was given.

A tape peeling test was performed by making cut lines with 1 mm intervals lengthwise and crosswise on each of the thermally cured films by means of a cutter and applying a Scotch tape thereto. The adherence between the cured film and the substrate was evaluated on the basis of the area of cured film transferred to the reverse face of the tape. When the area was less than 1%, the evaluation mark o was given. When the area was in the range of 1 to less than 5%, the evaluation mark Δ was given. When the area was 5% or greater, the evaluation mark x was given.

The evaluation results on the transmission and adherence are given in Table 2.

TABLE 1

| | Component (A) | | | | Component (B) Kind (parts by mass) | Component (C) Kind (parts by mass) | Component (D) Kind (parts by mass) | Amine Kind (parts by mass) | Solvent Kind (parts by mass) | Surfactant Kind (parts by mass) |
|---|---|---|---|---|---|---|---|---|---|---|
| | Kind (A1) | Kind (A2) | Blend ratio of resin (A1:A2) | Parts by mass | | | | | | |
| Ex. 1 | A1-1 | A2-1 | 50:50 | 100 | B1 (18.0) | C1 (1.2) | D1 (2.1) | E1 (0.02) | F1 (160) | G1 (0.1) |
| Ex. 2 | A1-2 | A2-2 | 50:50 | 100 | B2 (18.0) | C2 (0.5) | D2 (2.1) | E2 (0.02) | F2 (160) | G1 (0.1) |
| Ex. 3 | A1-3 | A2-3 | 50:50 | 100 | B3 (18.0) | C3 (2.0) | D1 (2.1) | E1 (0.02) | F3 (160) | G2 (0.1) |
| Ex. 4 | A1-4 | A2-4 | 50:50 | 100 | B4 (18.0) | C4 (0.8) | D1 (2.1) | E2 (0.02) | F1 (160) | G2 (0.1) |
| Ex. 5 | A1-5 | A2-5 | 50:50 | 100 | B1 (25.0) | C1 (0.6) + C4 (0.6) | D1 (2.1) | E1 (0.02) | F2 (120) | G3 (0.1) |
| Ex. 6 | A1-6 | A2-6 | 50:50 | 100 | B1 (11.0) | C5 (2.2) | D3 (2.1) | E1 (0.02) | F3 (120) | G3 (0.1) |
| Ex. 7 | A1-7 | A2-7 | 50:50 | 100 | B1 (9.0) + B3 (9.0) | C1 (1.5) | D1 (2.1) | E1 (0.02) | F1 (80) + F3 (80) | G1 (0.1) |
| Ex. 8 | A1-1 | A2-6 | 60:40 | 100 | B1 (25.0) | C2 (1.4) | D1 (2.1) | E2 (0.02) | F1 (80) + F3 (80) | G1 (0.1) |
| Ex. 9 | A1-3 | A2-5 | 30:70 | 100 | B1 (18.0) | C4 (1.5) | D1 (2.1) | E2 (0.02) | F2 (80) + F3 (80) | G1 (0.1) |
| Comp. 1 | A'1-8 | A2-1 | 50:50 | 100 | B1 (18.0) | C1 (2.0) | D1 (2.1) | E1 (0.02) | F1 (120) | G1 (0.1) |
| Comp. 2 | A'1-9 | — | 100:0 | 100 | B1 (18.0) | C1 (1.0) | D1 (2.1) | E1 (0.02) | F1 (120) | G1 (0.1) |
| Comp. 3 | A'-10 | | — | 100 | — | C'6 (10.0) | — | — | F3 (257) | — |
| Comp. 4 | A'-10 | | — | 100 | — | C'6 (5.0) | — | — | F3 (245) | — |

The particulars of the component (A), component (B), component (C), component (D), basic compound, solvent and surfactant of Table 1 are as follows.
Component (A)
The numerics appearing on the right side of individual structural units indicate a molar ratio of structural units.
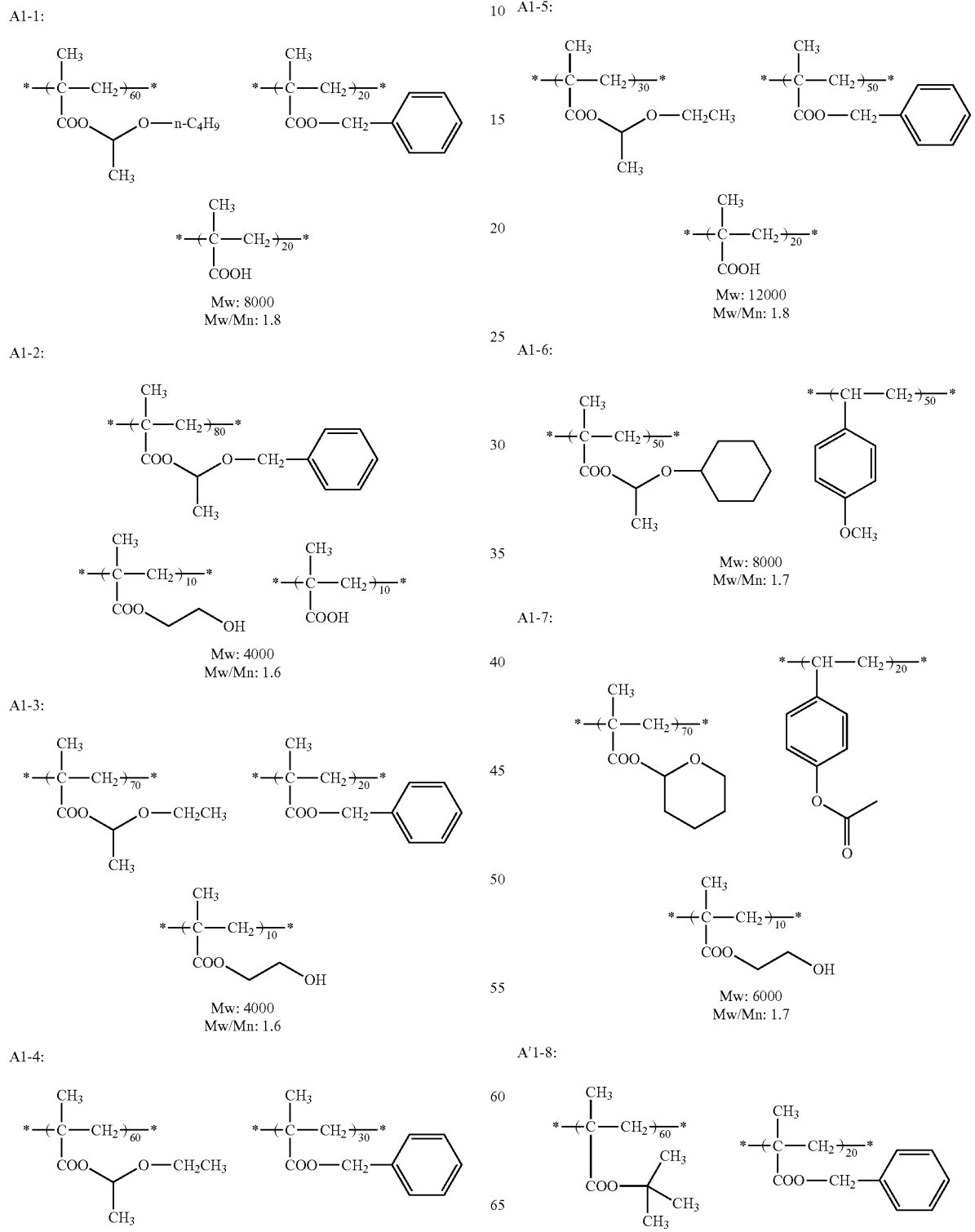

-continued
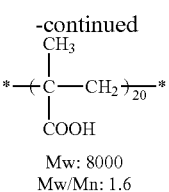
Mw: 8000
Mw/Mn: 1.6
A'-9:
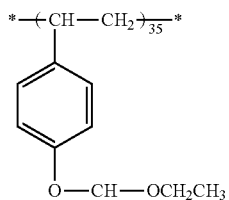 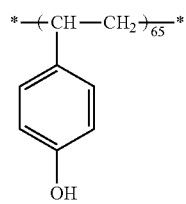
Mw: 9000
Mw/Mn: 1.2
A'-10:
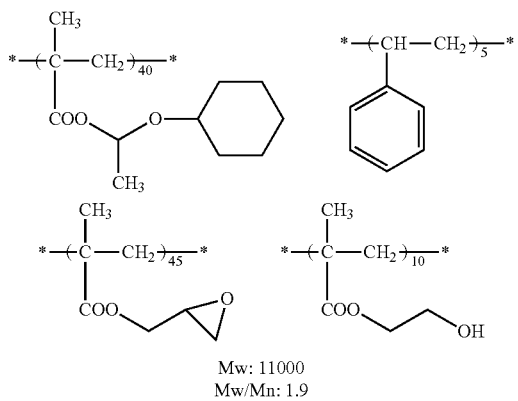
Mw: 11000
Mw/Mn: 1.9
A2-1:
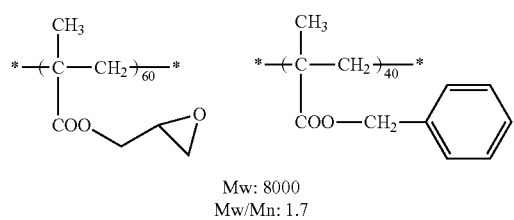
Mw: 8000
Mw/Mn: 1.7
A2-2:
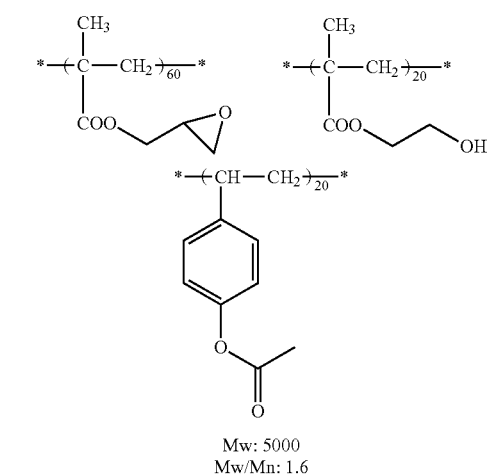
Mw: 5000
Mw/Mn: 1.6
A2-3:
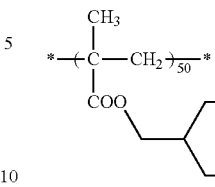 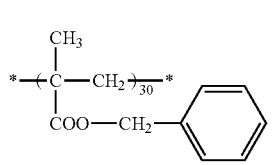
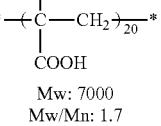
Mw: 7000
Mw/Mn: 1.7
A2-4:
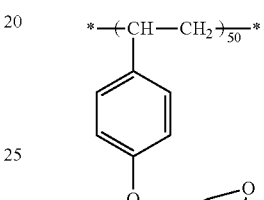 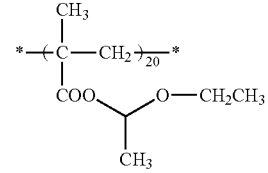
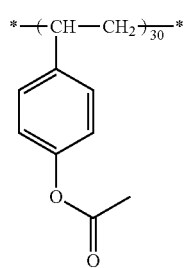
Mw: 4000
Mw/Mn: 1.6
A2-5:
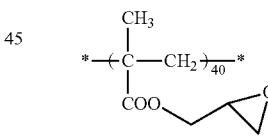 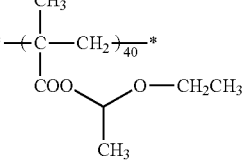
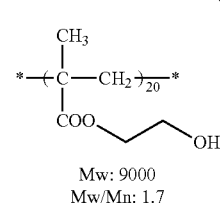
Mw: 9000
Mw/Mn: 1.7
A2-6:
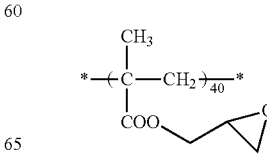 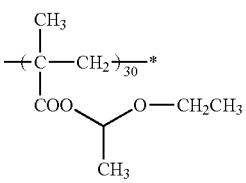

-continued

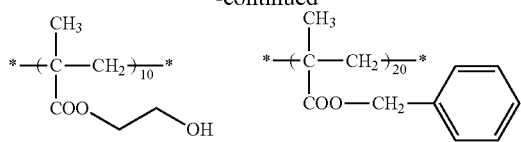

Mw: 8000
Mw/Mn: 1.7

A2-7:

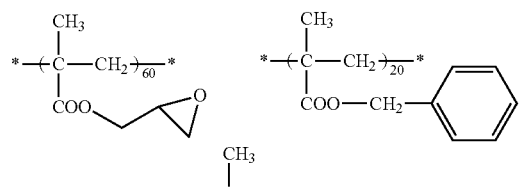

Mw: 4000
Mw/Mn: 1.6

Component (B)
B1: JER1001 (produced by Japan Epoxy Resin Co., Ltd.)
B2: JER834 (produced by Japan Epoxy Resin Co., Ltd.)
B3: JER157S70 (produced by Japan Epoxy Resin Co., Ltd.)
B4: JER154 (produced by Japan Epoxy Resin Co., Ltd.)
Component (C)

C1: IRAGACURE PAG 103 (produced by Ciba Speciality Chemicals Co., Ltd.)

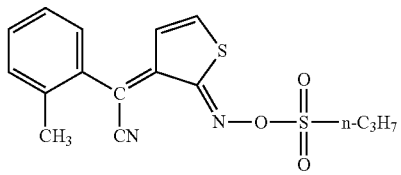

C2: IRAGACURE PAG 108 (produced by Ciba Speciality Chemicals Co., Ltd.)

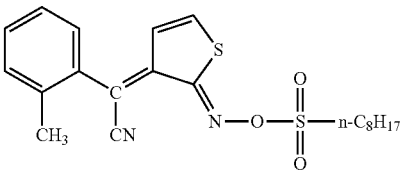

C3: CGI 1380 (produced by Ciba Speciality Chemicals Co., Ltd.)

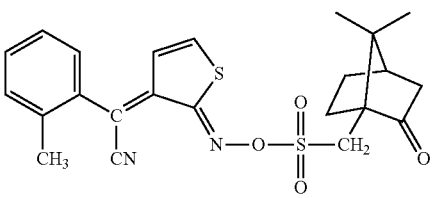

C4: IRAGACURE PAG 121 (produced by Ciba Speciality Chemicals Co., Ltd.)

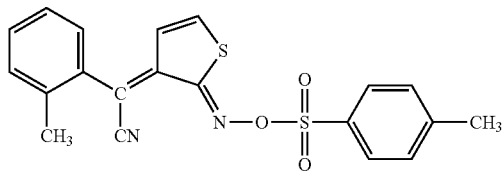

C5: CGI 725 (produced by Ciba Speciality Chemicals Co., Ltd.)

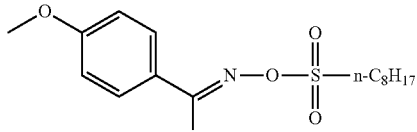

C'6: 4,7-di-n-butoxy-1-naphthyltetrahydrothiophenium trifluoromethanesulfonate

Component (D)
D1: γ-glycidoxypropyltrimethoxysilane
D2: β-(3,4-epoxycyclohexyl)ethyltrimethoxysilane
D3: γ-methacryloxypropyltrimethoxysilane
[Basic Compound]
E1: 4-dimethylaminopyridine
E2: 1,5-diazabicyclo[4,3,0]-5-nonene
[Solvent]
F1: propylene glycol monomethyl ether acetate
F2: diethylene glycol dimethyl ether
F3: diethylene glycol ethyl methyl ether
[Surfactant]
G1: Florad F-430 (produced by 3M Corporation)
G2: Megafac R-08 (produced by Dainippon Ink & Chemicals, Inc.)
G3: PolyFox PF-6320 (produced by OMNOVA SOLUTIONS, INC.)

TABLE 2

|  | Concentration of developer (mass %) | Sensitivity (Eopt) (mJ/cm$^2$) | Film retention ratio (%) | Heat resistance | Adherence | Transmission | Storage stability |
|---|---|---|---|---|---|---|---|
| Ex. 1 | 0.4 | 42 | 100 | ◯ | ◯ | ◯ | ◯ |
| Ex. 2 | 2.38 | 44 | 99 | ◯ | ◯ | ◯ | ◯ |
| Ex. 3 | 0.4 | 46 | 99 | ◯ | ◯ | ◯ | ◯ |
| Ex. 4 | 2.38 | 45 | 98 | ◯ | ◯ | ◯ | ◯ |
| Ex. 5 | 0.4 | 46 | 100 | ◯ | ◯ | ◯ | ◯ |
| Ex. 6 | 0.4 | 45 | 99 | ◯ | ◯ | ◯ | ◯ |
| Ex. 7 | 0.4 | 46 | 99 | ◯ | ◯ | ◯ | ◯ |
| Ex. 8 | 0.4 | 47 | 99 | ◯ | ◯ | ◯ | ◯ |
| Ex. 9 | 0.4 | 45 | 99 | ◯ | ◯ | ◯ | ◯ |

TABLE 2-continued

|  | Concentration of developer (mass %) | Sensitivity (Eopt) (mJ/cm²) | Film retention ratio (%) | Heat resistance | Adherence | Transmission | Storage stability |
|---|---|---|---|---|---|---|---|
| Comp. 1 | 0.4 | No image was formed. | | | ○ | ○ | ○ |
| Comp. 2 | 2.38 | 46 | 98 | X | ○ | Δ | ○ |
| Comp. 3 | 2.38 | >800 | 99 | ○ | X | ○ | ○ |
| Comp. 4 | 0.4 | >800 | 99 | ○ | X | ○ | ○ |

It is apparent from Table 2 that the positive photosensitive resin composition of the present invention excels in the sensitivity, film retention ratio and storage stability, and that by curing the same, there can be formed a cured film that excels in the heat resistance, adherence, transmission, etc.

2. Example II

Synthetic Example 1

Synthesis of Polymer A-1

A 500 ml three-necked flask was charged with 67.1 g (0.36 mol) of 1-n-butoxyethyl methacrylate, 34.1 g (0.24 mol) of glycidyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in propylene glycol monomethyl ether acetate. The heptane and methyl isobutyl ketone contained in the solution were distilled off in vacuum, thereby obtaining a propylene glycol monomethyl ether acetate solution of polymer A-1 (1-n-butoxyethyl methacrylate/glycidyl methacrylate).

In the obtained polymer, it was found by NMR measurement that the molar ratio between 1-n-butoxyethyl methacrylate units and glycidyl methacrylate units was about 60:40. Further, as a result of GPC measurement using polystyrene as a standard, it was found that the weight average molecular weight of the obtained polymer was about 8000 and the molecular weight distribution (Mw/Mn) thereof was 1.8.

Synthetic Example 2

Synthesis of Polymer A-2

A 500 ml three-necked flask was charged with 47.5.1 g (0.3 mol) of 1-ethoxyethyl methacrylate, 25.6 g (0.18 mol) of glycidyl methacrylate, 21.2 g (0.12 mol) of benzyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol dimethyl ether. The heptane and methyl isobutyl ketone contained in the solution were distilled off in vacuum, thereby obtaining a diethylene glycol dimethyl ether solution of polymer A-2 (1-ethoxyethyl methacrylate/glycidyl methacrylate/benzyl methacrylate).

In the obtained polymer, it was found by NMR measurement that the ratio of 1-ethoxyethyl methacrylate units, glycidyl methacrylate units and benzyl methacrylate units about 50:30:20. Further, as a result of GPC measurement using polystyrene as a standard, it was found that the weight average molecular weight of the obtained polymer was about 7000 and the molecular weight distribution (Mw/Mn) thereof was 1.7.

Synthetic Example 3

Synthesis of Polymer A-3

A 500 ml three-necked flask was charged with 79.3 g (0.36 mol) of 1-benzyloxyethyl methacrylate, 23.1 g (0.18 mol) of glycidyl acrylate, 7.8 g (0.06 mol) of 2-hydroxyethyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol ethylmethyl ether. The heptane and methyl isobutyl ketone contained in the solution were distilled off in vacuum, thereby obtaining a diethylene glycol ethylmethyl ether solution of polymer A-3 (1-benzyloxyethyl methacrylate/glycidyl acrylate/2-hydroxyethyl methacrylate).

In the obtained polymer, it was found by NMR measurement that the ratio of 1-benzyloxyethyl methacrylate units, glycidyl acrylate units and 2-hydroxyethyl methacrylate units was about 60:30:10. Further, as a result of GPC measurement using polystyrene as a standard, it was found that the weight average molecular weight of the obtained polymer was about 10000 and the molecular weight distribution (Mw/Mn) thereof was 1.8.

Synthetic Example 4

Synthesis of Polymer A-4

A 500 ml three-necked flask was charged with 43.3 g (0.3 mol) of 1-ethoxyethyl acrylate, 25.6 g (0.18 mol) of glycidyl methacrylate, 21.2 g (0.12 mol) of benzyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in propylene glycol monomethyl ether acetate. The heptane and methyl isobutyl ketone contained in the solution were distilled off in vacuum, thereby obtaining a propylene glycol monomethyl ether acetate solution of polymer A-4 (1-ethoxyethyl acrylate/glycidyl methacrylate/benzyl methacrylate).

In the obtained polymer, it was found by NMR measurement that the ratio of 1-ethoxyethyl acrylate units, glycidyl methacrylate units and benzyl methacrylate units was about 50:30:20. Further, as a result of GPC measurement using polystyrene as a standard, it was found that the weight average molecular weight of the obtained polymer was about 8000 and the molecular weight distribution (Mw/Mn) thereof was 1.7.

Synthetic Example 5

Synthesis of Polymer A-5

A 500 ml three-necked flask was charged with 76.4 g (0.36 mol) of 1-cyclohexyloxyethyl methacrylate, 35.3 g (0.18 mol) of 3,4-epoxycyclohexylmethyl methacrylate (Cyclomer M100 produced by Daicel Chemical Industries, Ltd.), 7.8 g (0.06 mol) of 2-hydroxyethyl methacrylate and 300 ml of methyl isobutyl ketone. A catalytic amount of 2,2'-azobis (methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol dimethyl ether. The heptane and methyl isobutyl ketone contained in the solution were distilled off in vacuum, thereby obtaining a diethylene glycol dimethyl ether solution of polymer A-5 (1-cyclohexyloxyethyl methacrylate/3,4-epoxycyclohexylmethyl methacrylate/2-hydroxyethyl methacrylate).

In the obtained polymer, it was found by NMR measurement that the ratio of 1-cyclohexyloxyethyl methacrylate units, 3,4-epoxycyclohexylmethyl methacrylate units and 2-hydroxyethyl methacrylate units was about 60:30:10. Further, as a result of GPC measurement using polystyrene as a standard, it was found that the weight average molecular weight of the obtained polymer was about 6000 and the molecular weight distribution (Mw/Mn) thereof was 1.8.

Synthetic Example 6

Synthesis of Polymer A-6

A 500 ml three-necked flask was charged with 57.0 g (0.36 mol) of 2-tetrahydropyranyl methacrylate, 31.7 g (0.18 mol) of p-vinylphenyl glycidyl ether, 7.8 g (0.06 mol) of 2-hydroxyethyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in diethylene glycol ethyl methyl ether. The heptane and methyl isobutyl ketone contained in the solution were distilled off in vacuum, thereby obtaining a diethylene glycol ethyl methyl ether solution of polymer A-6 (2-tetrahydropyranyl methacrylate/p-vinylphenyl glycidyl ether/2-hydroxyethyl methacrylate).

In the obtained polymer, it was found by NMR measurement that the ratio of 2-tetrahydropyranyl methacrylate units, p-vinylphenyl glycidyl ether units and 2-hydroxyethyl methacrylate units was about 60:30:10. Further, as a result of GPC measurement using polystyrene as a standard, it was found that the weight average molecular weight of the obtained polymer was about 7000 and the molecular weight distribution (Mw/Mn) thereof was 1.8.

Synthetic Example 7

Synthesis of Polymer A-7

A 500 ml three-necked flask was charged with 38.0 g (0.24 mol) of 1-ethoxyethyl methacrylate, 21.3 g (0.15 mol) of glycidyl methacrylate, 26.4 g (0.15 mol) of benzyl methacrylate, 5.2 g (0.06 mol) of methacrilic acid and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in mixed solvent of propylene glycol monomethyl ether acetate and diethylene glycol ethyl methyl ether. The heptane and methyl isobutyl ketone contained in the solution were distilled off in vacuum, thereby obtaining polymer A-7(1-ethoxyethyl methacrylate/glycidyl methacrylate/benzyl methacrylate/methacrilic acid) dissolved in mixed solvent of propylene glycol monomethyl ether acetate and diethylene glycol ethyl methyl ether.

In the obtained polymer, it was found by NMR measurement that the ratio of 1-ethoxyethyl methacrylate units, glycidyl methacrylate units, benzyl methacrylate units and methacrilic acids was about 40:25:25:10. Further, as a result of GPC measurement using polystyrene as a standard, it was found that the weight average molecular weight of the obtained polymer was about 7000 and the molecular weight distribution (Mw/Mn) thereof was 1.7.

Synthetic Example 8

Synthesis of polymer A-8

A 500 ml three-necked flask was charged with 47.5 g (0.3 mol) of 1-ethoxyethyl methacrylate, 33.2 g (0.18 mol) of 2-(3-oxacyclobutyl)butyl methacrylate, 21.2 g (0.12 mol) of benzyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in propylene glycol monomethyl ether acetate. The heptane and methyl isobutyl ketone contained in the solution were distilled off in vacuum, thereby obtaining a propylene glycol monomethyl ether acetate solution of polymer A-8 (1-ethoxyethyl methacrylate/2-(3-oxacyclobutyl)butyl methacrylate/benzyl methacrylate).

In the obtained polymer, it was found by NMR measurement that the ratio of 1-ethoxyethyl methacrylate units, 2-(3-oxacyclobutyl)butyl methacrylate units and benzyl methacrylate units was about 50:30:20. Further, as a result of GPC measurement using polystyrene as a standard, it was found that the weight average molecular weight of the obtained polymer was about 8000 and the molecular weight distribution (Mw/Mn) thereof was 1.7.

Synthetic Comparative Example 1

Synthesis of Polymer A'-9

A 500 ml three-necked flask was charged with 42.7 g (0.3 mol) of tert-butyl methacrylate, 21.3 g (0.15 mol) of glycidyl methacrylate, 26.4 g (0.15 mol) of benzyl methacrylate and 300 ml of methyl isobutyl ketone. A catalytic amount of 2,2'-azobis(methyl 2-methylpropionate) as a radical polymerization initiator was added to the mixture, and polymerization was performed in a nitrogen stream at 80° C. for six hours. The obtained reaction liquid was cooled, and poured in a large volume of heptane, thereby precipitating a polymer. The polymer crystal was collected by filtration, and dissolved in propylene glycol monomethyl ether acetate. The heptane and methyl isobutyl ketone contained in the solution were distilled off in vacuum, thereby obtaining a propylene glycol monomethyl ether acetate solution of polymer A'-9 (tert-butyl methacrylate/glycidyl methacrylate/benzyl methacrylate).

In the obtained polymer, it was found by NMR measurement that the ratio of tert-butyl methacrylate units, glycidyl methacrylate units and benzyl methacrylate units was about 50:25:25. Further, as a result of GPC measurement using polystyrene as a standard, it was found that the weight average molecular weight of the obtained polymer was about 7000 and the molecular weight distribution (Mw/Mn) thereof was 1.7.

Synthetic Comparative Example 2

Synthesis of Polymer A'-10

A 500 ml three-necked flask was charged with 72.1 g of poly-4-hydroxystyrene (VP-8000 produced by Nippon Soda Co., Ltd.), 16.4 g of ethyl vinyl ether and 300 ml of ethyl acetate. A catalytic amount of paratoluenesulfonic acid was added to the mixture, and reaction was performed in a nitrogen stream at room temperature for three hours. A small amount of triethylamine was added, and washing was performed with pure water. Propylene glycol monomethyl ether acetate was added to the ethyl acetate phase, and ethyl acetate was distilled off in vacuum, thereby obtaining a propylene glycol monomethyl ether acetate solution of polymer A'-10 (p-1-ethoxyethoxystyrene/p-hydroxystyrene).

In the obtained polymer, it was found by NMR measurement that the ratio between p-1-ethoxyethoxystyrene units and p-hydroxystyrene units was about 35:65. Further, as a result of GPC measurement using polystyrene as a standard, it was found that the weight average molecular weight of the obtained polymer was about 9000 and the molecular weight distribution (Mw/Mn) thereof was 1.2.

Synthetic Comparative Example 3

Synthesis of Polymer A'-11

Polymer A'-11 was synthesized in accordance with Synthetic Example 1 of JP-A-2004-264623.

A three-necked flask was charged with 7 parts by mass of 2,2'-azobis(2,4-dimethylvaleronitrile) and 200 parts by mass of diethylene glycol ethyl methyl ether, and further charged with 40 parts by mass of 1-(cyclohexyloxy)ethyl methacrylate, 5 parts by mass of styrene, 45 parts by mass of glycidyl methacrylate, 10 parts by mass of 2-hydroxyethyl methacrylate and 3 parts by mass of α-methylstyrene dimer. The interior of the flask was flushed with nitrogen, and gentle agitation was started. The solution was heated to 70° C., and this temperature was maintained for five hours, thereby obtaining a polymer solution containing copolymer A'-11. As a result of GPC measurement using polystyrene as a standard, it was found that the weight average molecular weight of the obtained polymer was about 11,000 and the molecular weight distribution (Mw/Mn) thereof was 1.9.

Examples 10 to 18 and Comparative Examples 5 to 8

(1) Preparation of Solution of Positive Photosensitive Resin Composition

Solutions of positive photosensitive resin composition were prepared using the components of Table 3 below in the same manner as in Example I.

(2) Evaluation of Storage Stability

The storage stability of each of the compositions was evaluated in the same manner as in Example I. The results are given in Table 4 below.

(3) Evaluation of Sensitivity and Film Retention Ratio at Development

The sensitivity and film retention ratio at development of each of the compositions were evaluated in the same manner as in Example I. The results are given in Table 4 below.

(4) Heat Resistance

The heat resistance of each of the compositions was evaluated in the same manner as in Example I. The results are given in Table 4 below.

(5) Transmission and Adherence

The transmission and adherence of each of the compositions were evaluated in the same manner as in Example I. The results are given in Table 4 below.

TABLE 3

| | Component (A) Kind (parts by mass) | Component (B) Kind (parts by mass) | Component (C) Kind (parts by mass) | Component (D) Kind (parts by mass) | Amine Kind (parts by mass) | Solvent Kind (parts by mass) | Surfactant Kind (parts by mass) |
|---|---|---|---|---|---|---|---|
| Ex. 10 | A-1 (100) | B1 (18.0) | C1 (1.2) | D1 (2.1) | E1 (0.02) | F1 (160) | G1 (0.1) |
| Ex. 11 | A-2 (100) | B2 (18.0) | C2 (0.5) | D2 (2.1) | E2 (0.02) | F2 (160) | G1 (0.1) |
| Ex. 12 | A-3 (100) | B3 (18.0) | C3 (2.0) | D3 (2.1) | E1 (0.02) | F3 (160) | G2 (0.1) |
| Ex. 13 | A-4 (100) | B4 (18.0) | C4 (0.8) | D1 (2.1) | E2 (0.02) | F1 (160) | G2 (0.1) |
| Ex. 14 | A-5 (100) | B1 (25.0) | C5 (1.2) | D1 (2.1) | E1 (0.02) | F2 (120) | G3 (0.1) |
| Ex. 15 | A-6 (100) | B1 (11.0) | C1 (1.0) + C4 (1.0) | D1 (2.1) | E1 (0.02) | F3 (120) | G3 (0.1) |
| Ex. 16 | A-7 (100) | B1 (9.0) + B3 (9.0) | C1 (1.5) | D1 (2.1) | E1 (0.02) | F1 (80) + F3 (80) | G1 (0.1) |
| Ex. 17 | A-8 (100) | B1 (18.0) | C1 (2.0) | D1 (2.1) | E1 (0.02) | F1 (160) | G1 (0.1) |

TABLE 3-continued

| | Component (A) Kind (parts by mass) | Component (B) Kind (parts by mass) | Component (C) Kind (parts by mass) | Component (D) Kind (parts by mass) | Amine Kind (parts by mass) | Solvent Kind (parts by mass) | Surfactant Kind (parts by mass) |
|---|---|---|---|---|---|---|---|
| Ex. 18 | A-1 (100) | B1 (18.0) | C1 (1.8) | — | E1 (0.02) | F1 (160) | G1 (0.1) |
| Comp. 5 | A'-9 (100) | B1 (18.0) | C1 (2.0) | D1 (2.1) | E1 (0.02) | F1 (120) | G1 (0.1) |
| Comp. 6 | A'-10 (100) | B1 (18.0) | C1 (2.0) | D1 (2.1) | E1 (0.02) | F1 (120) | G1 (0.1) |
| Comp. 7 | A'-11 (100) | — | C'6 (10.0) | — | — | F3 (257) | — |
| Comp. 8 | A'-11 (100) | — | C'6 (5.0) | — | — | F3 (245) | — |

The particulars of the component (A) of Table 3 are as follows. The component (B), component (C), component (D), basic compound, solvent and surfactant of the table are the same as in Example I.

Component (A)

The numerics appearing on the right side of individual structural units indicate a molar ratio of structural units.

A-1:

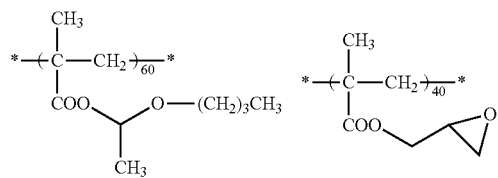

Mw: 8000
Mw/Mn: 1:8

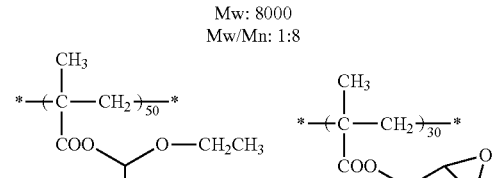

Mw: 8000
Mw/Mn: 1:8

A-3:

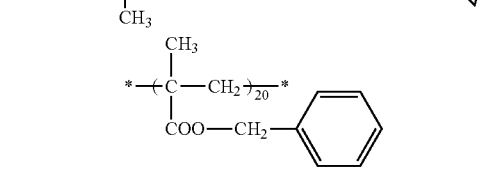

Mw: 10000
Mw/Mn: 1:8

A-4:

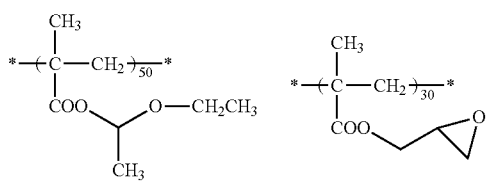

Mw: 8000
Mw/Mn: 1:7

A-5:

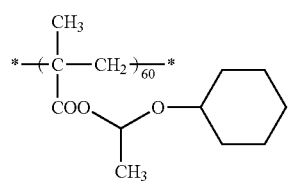

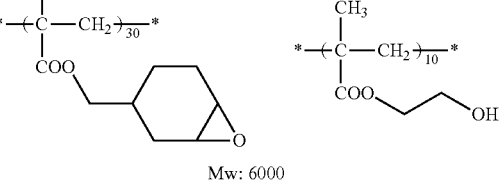

Mw: 6000
Mw/Mn: 1.8

A-6:

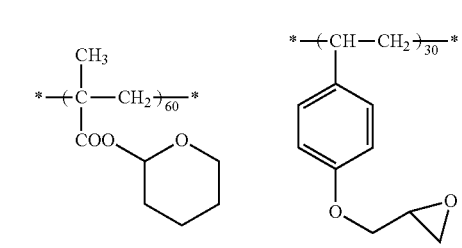

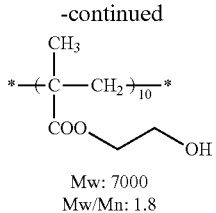
A-7:
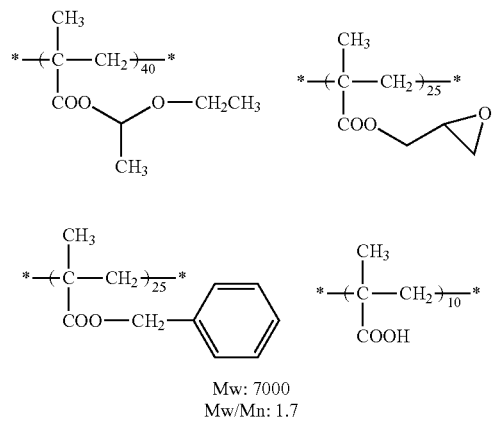
A-8:
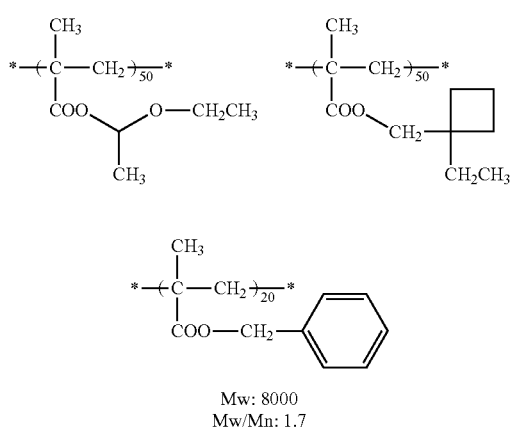
A'-9:
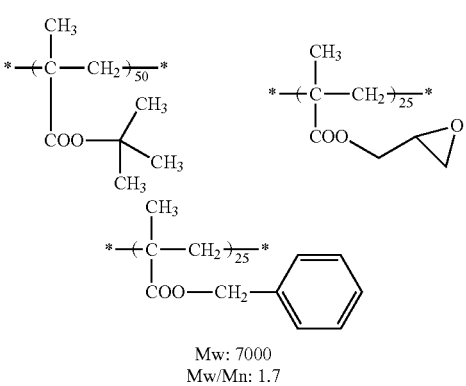
Mw: 7000
Mw/Mn: 1.7
A'-10:
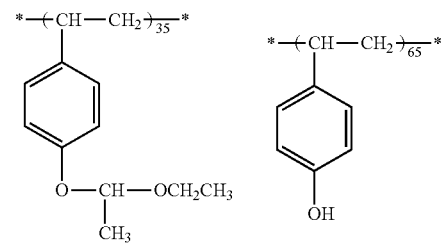
Mw: 9000
Mw/Mn: 1.2
A'-11:
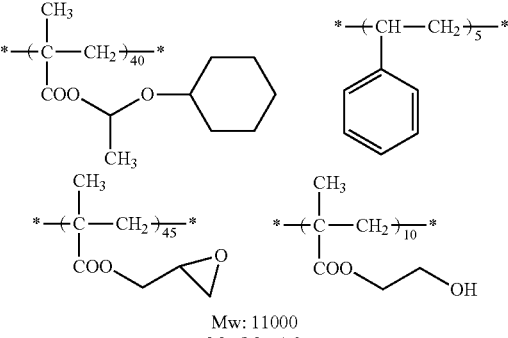
Mw: 11000
Mw/Mn: 1.9
TABLE 4
| | Concentration of developer (mass %) | Sensitivity (Eopt) (mJ/cm$^2$) | Film retention ratio (%) | Heat resistance | Adherence | Transmission | Storage stability |
|---|---|---|---|---|---|---|---|
| Ex. 10 | 0.4 | 42 | 100 | ○ | ○ | ○ | ○ |
| Ex. 11 | 2.38 | 44 | 99 | ○ | ○ | ○ | ○ |
| Ex. 12 | 0.4 | 46 | 99 | ○ | ○ | ○ | ○ |
| Ex. 13 | 2.38 | 45 | 98 | ○ | ○ | ○ | ○ |
| Ex. 14 | 2.38 | 52 | 100 | ○ | ○ | ○ | ○ |
| Ex. 15 | 0.4 | 45 | 99 | ○ | ○ | ○ | ○ |
| Ex. 16 | 0.4 | 46 | 99 | ○ | ○ | ○ | ○ |
| Ex. 17 | 0.4 | 43 | 100 | Δ | ○ | ○ | ○ |
| Ex. 18 | 0.4 | 48 | 99 | ○ | Δ | ○ | ○ |
| Comp. 5 | 0.4 | No image was formed. | | | ○ | ○ | ○ |
| Comp. 6 | 2.38 | 48 | 98 | X | ○ | Δ | ○ |
| Comp. 7 | 2.38 | 850 | 99 | ○ | ○ | ○ | ○ |
| Comp. 8 | 0.4 | 1000 | 99 | ○ | ○ | ○ | ○ |

It is apparent from Table 4 that the positive photosensitive resin composition of the present invention excels in the sensitivity, film retention ratio and storage stability, and that by curing the same, there can be formed a cured film that excels in the heat resistance, adherence, transmission, etc.

What is claimed is:

1. A positive photosensitive resin composition comprising (A1) a resin containing any of structural units of general formula (1) below, which resin is insoluble in alkali or sparingly soluble in alkali but when its acid-dissociative group is dissociated, becomes soluble in alkali; (A2) a polymer or copolymer containing a structural unit derived from a radical-polymerizable monomer containing an epoxy group; (B) a compound containing two or more epoxy groups in its molecule, provided that the polymer or copolymer (A2) is not included in this compound; and (C) a compound that when exposed to actinic rays of 300 nm or longer wavelength, generates an acid,

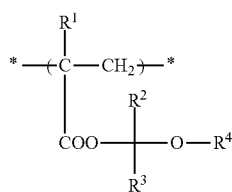
(1)

in which
R$^1$ represents a hydrogen atom, a methyl group, a halogen atom or a cyano group,
each of R$^2$ and R$^3$ independently represents a hydrogen atom, or a linear alkyl group, provided that R$^2$ and R$^3$ are not simultaneously hydrogen atoms, and
R$^4$ represents a linear, branched or cyclic alkyl group or an aralkyl group, wherein the alkyl group is optionally substituted with an alkoxy group having 1 to 5 carbon atoms or a halogen atom,
provided that R$^2$ and R$^4$ may be linked to each other to thereby form a cyclic ether.

2. The positive photosensitive resin composition according to claim 1, wherein the component (A2) contains the structural unit derived from a radical-polymerizable monomer containing an epoxy group and any of structural units of general formula (1).

3. The positive photosensitive resin composition according to claim 1, wherein the radical-polymerizable monomer containing an epoxy group is 3,4-epoxycyclohexylmethyl acrylate or 3,4-epoxycyclohexylmethyl methacrylate.

4. The positive photosensitive resin composition according to claim 1, wherein the component (C) contains a compound containing any of oxime sulfonate groups of general formula (2) below,

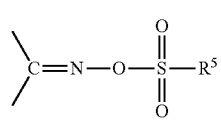
(2)

in which
R$^5$ represents an optionally substituted linear, branched or cyclic alkyl group or an optionally substituted aryl group.

5. The positive photosensitive resin composition according to claim 1, wherein the component (C) contains any of compounds of general formula (3) below,

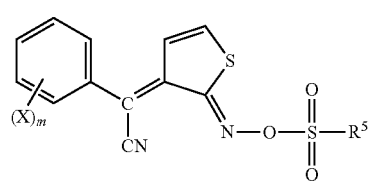
(3)

in which
R$^5$ represents an optionally substituted linear, branched or cyclic alkyl group or an optionally substituted aryl group,
X represents an alkyl group, an alkoxy group or a halogen atom, and
m is an integer of 0 to 3, provided that when m is 2 or 3, a plurality of X's may be identical to or different from each other.

6. The positive photosensitive resin composition according to claim 1, further comprising an adhesion aid (D).

7. A method of forming a cured film, comprising the steps of applying the positive photosensitive resin composition according to claim 1 to a substrate and drying the applied composition to thereby form a film; exposing the film through a mask to actinic rays of 300 nm or longer wavelength; developing the exposed film with an alkali developer to thereby form a pattern; and baking the formed pattern.

8. The method of forming a cured film according to claim 7, further comprising exposing the pattern on its entire surface after the development with an alkali developer to thereby form a pattern but before the baking of the formed pattern.

9. A cured film obtained by the method of claim 7.

10. The positive photosensitive resin composition according to claim 1, wherein the mass ratio of component (A1) to component (A2) is 30:70 to 70:30.

11. The positive photosensitive resin composition according to claim 1, wherein the number of carbon atoms of an alkyl group in R$^2$ and R$^3$ of general formula (1) is 1-6.

12. A positive photosensitive resin composition comprising (A') a resin containing not only any of structural units of general formula (1) below but also a structural unit containing a functional group capable of reacting with a carboxyl group to thereby form a covalent bond, which resin is insoluble in alkali or sparingly soluble in alkali but when its acid-dissociative group is dissociated, becomes soluble in alkali; (B) a compound containing two or more epoxy groups in its molecule, provided that the resin (A') is not included in this compound; and (C) a compound that when exposed to actinic rays of 300 nm or longer wavelength, generates an acid,

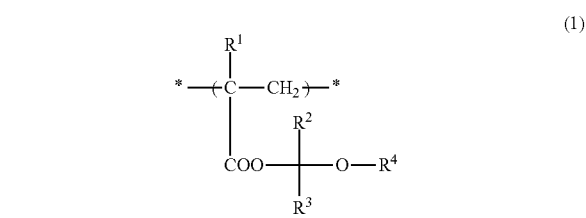
(1)

in which

R[1] represents a hydrogen atom, a methyl group, a halogen atom or a cyano group, each of R[2] and R[3] independently represents a hydrogen atom, or a linear alkyl group, provided that R[2] and R[3] are not simultaneously hydrogen atoms, and R[4] represents a linear, branched or cyclic alkyl group or an aralkyl group, wherein the alkyl group is optionally substituted with an alkoxy group or a halogen atom, provided that R[2] and R[4] may be linked to each other to thereby form a cyclic ether.

13. The positive photosensitive resin composition according to claim 12, wherein the functional group capable of reacting with a carboxyl group to thereby form a covalent bond, contained in the component (A') is an epoxy group.

14. The positive photosensitive resin composition according to claim 12, wherein the structural unit containing a functional group capable of reacting with a carboxyl group to thereby from a covalent bond is the structural unit derived from 3,4-epoxycyclohexylmethyl acrylate or 3,4-epoxycyclohexylmethyl methacrylate.

15. The positive photosensitive resin composition according to claim 12, wherein the functional group capable of reacting with a carboxyl group to thereby form a covalent bond, contained in the component (A') is an oxetane group.

16. The positive photosensitive resin composition according to claim 12, wherein the component (C) contains a compound containing any of oxime sulfonate groups of general formula (2) below,

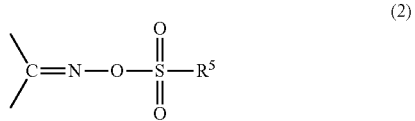

(2)

in which

R[5] represents an optionally substituted linear, branched or cyclic alkyl group or an optionally substituted aryl group.

17. The positive photosensitive resin composition according to claim 12, wherein the component (C) contains any of compounds of general formula (3) below,

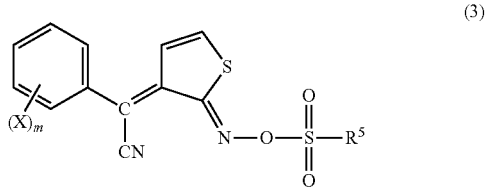

(3)

in which

R[5] represents an optionally substituted linear, branched or cyclic alkyl group or an optionally substituted aryl group, X represents an alkyl group, an alkoxy group or a halogen atom, and m is an integer of 0 to 3, provided that when m is 2 or 3, a plurality of X's may be identical to or different from each other.

18. The positive photosensitive resin composition according to claim 12, further comprising an adhesion aid (D).

19. A method of forming a cured film, comprising the steps of applying the positive photosensitive resin composition according to claim 12 to a substrate and drying the applied composition to thereby form a film; exposing the film through a mask to actinic rays of 300 nm or longer wavelength; developing the exposed film with an alkali developer to thereby form a pattern; and baking the formed pattern.

20. The method of forming a cured film according to claim 19, further comprising exposing the pattern on its entire surface after the development with an alkali developer to thereby form a pattern but before the baking of the formed pattern.

21. A cured film obtained by the method of claim 19.

22. The positive photosensitive resin composition according to claim 1, wherein at least one of component (A1) and component (A2) further contains a structural unit derived from acrylic acid or methacrylic acid.

* * * * *